(12) United States Patent
Wan et al.

(10) Patent No.: US 8,969,101 B1
(45) Date of Patent: Mar. 3, 2015

(54) THREE AXIS MAGNETIC SENSOR DEVICE AND METHOD USING FLEX CABLES

(75) Inventors: Hong Wan, Plymouth, MN (US); Anthony F. Flannery, Los Gatos, CA (US)

(73) Assignee: mCube Inc., San Jose, CA (US)

( * ) Notice: Subject to any disclaimer, the term of this patent is extended or adjusted under 35 U.S.C. 154(b) by 329 days.

(21) Appl. No.: 13/211,305

(22) Filed: Aug. 17, 2011

(51) Int. Cl.
*H01L 21/00* (2006.01)

(52) U.S. Cl.
USPC ............... 438/3; 257/421; 257/422; 257/423; 257/424; 257/425; 257/426; 257/428

(58) Field of Classification Search
None
See application file for complete search history.

(56) References Cited

U.S. PATENT DOCUMENTS

| | | |
|---|---|---|
| 3,614,677 A | 10/1971 | Wilfinger |
| 4,954,698 A | 9/1990 | Yasunaga et al. |
| 5,140,745 A | 8/1992 | McKenzie |
| 5,157,841 A | 10/1992 | Dinsmore |
| 5,173,597 A | 12/1992 | Anglin |
| 5,488,765 A | 2/1996 | Kubota et al. |
| 5,493,769 A | 2/1996 | Sakai et al. |
| 5,610,414 A | 3/1997 | Yoneda et al. |
| 5,668,033 A | 9/1997 | Ohara |
| 5,729,074 A | 3/1998 | Shiomi et al. |
| 6,046,409 A | 4/2000 | Ishii et al. |
| 6,076,731 A | 6/2000 | Terrell |
| 6,115,261 A | 9/2000 | Platt et al. |
| 6,188,322 B1 | 2/2001 | Yao et al. |
| 6,263,736 B1 | 7/2001 | Thunder et al. |
| 6,278,178 B1 | 8/2001 | Kwon et al. |
| 6,480,699 B1 | 11/2002 | Lovoi |
| 6,483,172 B1 | 11/2002 | Cote |
| 6,485,273 B1 | 11/2002 | Goodwin-Johansson |
| 6,534,726 B1 | 3/2003 | Okada et al. |
| 6,576,999 B2 | 6/2003 | Sakai et al. |
| 6,656,604 B2 | 12/2003 | Hasewaga |
| 6,753,664 B2 | 6/2004 | Neufeld et al. |
| 6,855,572 B2 | 2/2005 | Jeung et al. |
| 6,912,336 B2 | 6/2005 | Ishii |
| 6,933,165 B2 | 8/2005 | Musolf et al. |
| 6,979,872 B2 | 12/2005 | Borwick et al. |
| 7,019,434 B2 | 3/2006 | Helmbrecht |
| 7,095,226 B2 | 8/2006 | Wan et al. |
| 7,145,555 B2 | 12/2006 | Taylor et al. |
| 7,183,630 B1 | 2/2007 | Fogelson et al. |
| 7,193,312 B2 | 3/2007 | Boon et al. |

(Continued)

OTHER PUBLICATIONS

U.S. Appl. No. 12/913,440, Final Office Action mailed Oct. 10, 2013, 10 pages.

(Continued)

*Primary Examiner* — Davienne Monbleau
*Assistant Examiner* — Leslie Pilar Cruz
(74) *Attorney, Agent, or Firm* — Kilpatrick Townsend & Stockton LLP

(57) ABSTRACT

A method and structure for a three-axis magnetic field sensing device. An IC layer having first bond pads and second bond pads can be formed overlying a substrate/SOI member with a first, second, and third magnetic sensing element coupled the IC layer. One or more conductive cables can be formed to couple the first and second bond pads of the IC layer. A portion of the substrate member and IC layer can be removed to separate the first and second magnetic sensing elements on a first substrate member from the third sensing element on a second substrate member, and the third sensing element can be coupled to the side-wall of the first substrate member.

14 Claims, 14 Drawing Sheets

(56) References Cited

U.S. PATENT DOCUMENTS

| | | |
|---|---|---|
| 7,195,945 B1 | 3/2007 | Edelstein et al. |
| 7,239,000 B2 | 7/2007 | Witcraft |
| 7,253,079 B2 | 8/2007 | Hanson et al. |
| 7,258,009 B2 | 8/2007 | Imai |
| 7,358,724 B2 | 4/2008 | Taylor et al. |
| 7,370,530 B2 | 5/2008 | DCamp et al. |
| 7,391,091 B2 | 6/2008 | Tondra |
| 7,402,449 B2 | 7/2008 | Fukuda et al. |
| 7,430,674 B2 | 9/2008 | Van Mueller et al. |
| 7,453,269 B2 | 11/2008 | Won et al. |
| 7,454,705 B2 | 11/2008 | Cadez et al. |
| 7,456,042 B2 | 11/2008 | Stark |
| 7,493,496 B2 | 2/2009 | Smith et al. |
| 7,498,715 B2 | 3/2009 | Yang |
| 7,511,379 B1 | 3/2009 | Flint |
| 7,514,760 B1 | 4/2009 | Quevy |
| 7,521,783 B2 | 4/2009 | Tsai et al. |
| 7,536,909 B2 | 5/2009 | Zhao et al. |
| 7,585,750 B2 | 9/2009 | Do et al. |
| 7,599,277 B1 | 10/2009 | Kato et al. |
| 7,612,443 B1 | 11/2009 | Bernstein et al. |
| 7,671,478 B2 | 3/2010 | Wathanawasam et al. |
| 7,676,340 B2 | 3/2010 | Yasui |
| 7,690,255 B2 | 4/2010 | Gogoi et al. |
| 7,708,189 B1 | 5/2010 | Cipriano |
| 7,713,785 B1 | 5/2010 | Flint |
| 7,779,689 B2 | 8/2010 | Li et al. |
| 7,814,791 B2 | 10/2010 | Andersson et al. |
| 7,814,792 B2 | 10/2010 | Tateyama et al. |
| 7,814,793 B2 | 10/2010 | Sato |
| 7,861,422 B2 | 1/2011 | McDonald |
| 7,891,103 B2 | 2/2011 | Mayor |
| 8,011,577 B2 | 9/2011 | Mullen et al. |
| 8,016,191 B2 | 9/2011 | Bonalle et al. |
| 8,037,758 B2 | 10/2011 | Sato |
| 8,056,412 B2 | 11/2011 | Rutkiewicz et al. |
| 8,061,049 B2 | 11/2011 | Mayor |
| 8,070,055 B2 | 12/2011 | Block et al. |
| 8,087,296 B2 | 1/2012 | Ueda et al. |
| 8,140,358 B1 | 3/2012 | Ling et al. |
| 8,148,808 B2 | 4/2012 | Braden et al. |
| 8,165,323 B2 | 4/2012 | Zhou |
| 8,181,874 B1 | 5/2012 | Wan et al. |
| 8,227,285 B1 | 7/2012 | Yang |
| 8,236,577 B1 | 8/2012 | Hsu |
| 8,245,923 B1 | 8/2012 | Merrill et al. |
| 8,250,921 B2 | 8/2012 | Nasiri et al. |
| 8,259,311 B2 | 9/2012 | Petschko |
| 8,324,047 B1 | 12/2012 | Yang |
| 8,342,021 B2 | 1/2013 | Oshio |
| 8,367,522 B1 | 2/2013 | Yang |
| 8,395,252 B1 | 3/2013 | Yang |
| 8,395,381 B2 | 3/2013 | Lo |
| 8,402,666 B1 | 3/2013 | Hsu et al. |
| 8,407,905 B1 | 4/2013 | Hsu et al. |
| 8,421,082 B1 | 4/2013 | Yang |
| 8,476,084 B1 | 7/2013 | Yang et al. |
| 8,476,129 B1 | 7/2013 | Jensen et al. |
| 8,477,473 B1 | 7/2013 | Koury et al. |
| 8,486,723 B1 | 7/2013 | Wan et al. |
| 2001/0053565 A1 | 12/2001 | Khoury |
| 2002/0072163 A1 | 6/2002 | Wong et al. |
| 2002/0134837 A1 | 9/2002 | Kishon |
| 2003/0058069 A1 | 3/2003 | Schwartz et al. |
| 2003/0095115 A1 | 5/2003 | Brian et al. |
| 2003/0133489 A1 | 7/2003 | Hirota et al. |
| 2003/0184189 A1 | 10/2003 | Sinclair |
| 2003/0230802 A1 | 12/2003 | Poo et al. |
| 2004/0002808 A1 | 1/2004 | Hashimoto et al. |
| 2004/0016995 A1 | 1/2004 | Kuo et al. |
| 2004/0017644 A1 | 1/2004 | Goodwin-Johansson |
| 2004/0056742 A1 | 3/2004 | Dabbaj |
| 2004/0063325 A1 | 4/2004 | Urano et al. |
| 2004/0104268 A1 | 6/2004 | Bailey |
| 2004/0113246 A1 | 6/2004 | Boon |
| 2004/0119836 A1 | 6/2004 | Kitaguchi et al. |
| 2004/0140962 A1 | 7/2004 | Wang et al. |
| 2004/0177045 A1 | 9/2004 | Brown |
| 2004/0207035 A1 | 10/2004 | Witcraft et al. |
| 2004/0227201 A1 | 11/2004 | Borwick et al. |
| 2005/0074147 A1 | 4/2005 | Smith et al. |
| 2005/0090038 A1 | 4/2005 | Wallace |
| 2005/0174338 A1 | 8/2005 | Ing |
| 2005/0199791 A1 | 9/2005 | Sengoku et al. |
| 2005/0247787 A1 | 11/2005 | Von Mueller et al. |
| 2006/0049826 A1 | 3/2006 | Daneman et al. |
| 2006/0081954 A1 | 4/2006 | Tondra et al. |
| 2006/0141786 A1 | 6/2006 | Boezen et al. |
| 2006/0168832 A1 | 8/2006 | Yasui et al. |
| 2006/0192465 A1 | 8/2006 | Kornbluh et al. |
| 2006/0208326 A1 | 9/2006 | Nasiri et al. |
| 2006/0211044 A1 | 9/2006 | Green |
| 2006/0238621 A1 | 10/2006 | Okubo et al. |
| 2006/0243049 A1 | 11/2006 | Ohta et al. |
| 2006/0274399 A1 | 12/2006 | Yang |
| 2007/0046239 A1 | 3/2007 | Hashizume |
| 2007/0132733 A1 | 6/2007 | Ram |
| 2007/0152976 A1 | 7/2007 | Townsend et al. |
| 2007/0181962 A1 | 8/2007 | Partridge et al. |
| 2007/0200564 A1 | 8/2007 | Motz et al. |
| 2007/0281379 A1 | 12/2007 | Stark et al. |
| 2008/0014682 A1 | 1/2008 | Yang et al. |
| 2008/0066547 A1 | 3/2008 | Tanaka et al. |
| 2008/0110259 A1 | 5/2008 | Takeno |
| 2008/0119000 A1 | 5/2008 | Yeh et al. |
| 2008/0123242 A1 | 5/2008 | Zhou |
| 2008/0210007 A1 | 9/2008 | Yamaji et al. |
| 2008/0211043 A1 | 9/2008 | Chen |
| 2008/0211113 A1 | 9/2008 | Chua et al. |
| 2008/0211450 A1 | 9/2008 | Yamada et al. |
| 2008/0277747 A1 | 11/2008 | Ahmad |
| 2008/0283991 A1 | 11/2008 | Reinert |
| 2008/0316654 A1* | 12/2008 | Aiso ............................ 360/324 |
| 2009/0007661 A1 | 1/2009 | Nasiri et al. |
| 2009/0015251 A1 | 1/2009 | Azumi et al. |
| 2009/0049911 A1 | 2/2009 | Fukuda et al. |
| 2009/0108440 A1 | 4/2009 | Meyer et al. |
| 2009/0115412 A1 | 5/2009 | Fuse |
| 2009/0153500 A1 | 6/2009 | Cho et al. |
| 2009/0262074 A1 | 10/2009 | Nasiri et al. |
| 2009/0267906 A1 | 10/2009 | Schroderus |
| 2009/0307557 A1 | 12/2009 | Rao et al. |
| 2009/0321510 A1 | 12/2009 | Day et al. |
| 2010/0044121 A1 | 2/2010 | Simon et al. |
| 2010/0045282 A1 | 2/2010 | Shibasaki et al. |
| 2010/0071467 A1 | 3/2010 | Nasiri et al. |
| 2010/0075481 A1 | 3/2010 | Yang |
| 2010/0083756 A1 | 4/2010 | Merz et al. |
| 2010/0095769 A1 | 4/2010 | Matsumoto et al. |
| 2010/0109102 A1 | 5/2010 | Chen et al. |
| 2010/0171570 A1 | 7/2010 | Chandrahalim |
| 2010/0208118 A1 | 8/2010 | Ueyama |
| 2010/0236327 A1 | 9/2010 | Mao |
| 2010/0248662 A1 | 9/2010 | Sheynblat et al. |
| 2010/0260388 A1 | 10/2010 | Garret et al. |
| 2010/0302199 A1 | 12/2010 | Taylor et al. |
| 2010/0306117 A1 | 12/2010 | Terayoko |
| 2010/0307016 A1 | 12/2010 | Mayor et al. |
| 2010/0312519 A1 | 12/2010 | Huang et al. |
| 2011/0131825 A1 | 6/2011 | Mayor et al. |
| 2011/0146401 A1 | 6/2011 | Inaguma et al. |
| 2011/0154905 A1 | 6/2011 | Hsu |
| 2011/0172918 A1 | 7/2011 | Tome |
| 2011/0183456 A1 | 7/2011 | Hsieh et al. |
| 2011/0198395 A1 | 8/2011 | Chen |
| 2011/0244599 A1* | 10/2011 | Whig et al. ...................... 438/3 |
| 2011/0265574 A1 | 11/2011 | Yang |
| 2011/0266340 A9 | 11/2011 | Block et al. |
| 2011/0312349 A1 | 12/2011 | Forutanpour et al. |
| 2012/0007597 A1 | 1/2012 | Seeger et al. |

(56) References Cited

U.S. PATENT DOCUMENTS

2012/0007598 A1 1/2012 Lo et al.
2012/0215475 A1 8/2012 Rutledge et al.

OTHER PUBLICATIONS

U.S. Appl. No. 12/944,712 Final Office Action mailed Aug. 21, 2013, 15 pages.
U.S. Appl. No. 12/983,309 Notice of Allowance mailed Aug. 13, 2013, 11 pages.
U.S. Appl. No. 13/924,457 Notice of Allowance mailed Sep. 18, 2013, 11 pages.
U.S. Appl. No. 13/035,968 Non-Final Office Action mailed Jul. 31, 2013, 8 pages.
U.S. Appl. No. 13/035,969 Non-Final Office Action mailed Oct. 25, 2013, 11 pages.
U.S. Appl. No. 13/751,014 Notice of Allowance mailed Jul. 31, 2013, 9 pages.
U.S. Appl. No. 12/787,368 Non-Final Office Action mailed Sep. 19, 2013, 19 pages.
U.S. Appl. No. 13/922,983 Notice of Allowance mailed Oct. 7, 2013, 10 pages.
U.S. Appl. No. 12/787,200 Notice of Allowance mailed Sep. 26, 2013, 11 pages.
U.S. Appl. No. 13/177,053 Non-Final Office Action mailed Sep. 18, 2013, 12 pages.
U.S. Appl. No. 13/164,311 Notice of Allowance mailed Sep. 17, 2013, 8 pages.
U.S. Appl. No. 13/163,672 Non-Final Office Action mailed Sep. 5, 2013, 7 pages.
U.S. Appl. No. 12/940,025 Notice of Allowance mailed Oct. 17, 2013, 10 pages.
U.S. Appl. No. 13/069,355 Final Office Action mailed Oct. 31, 2013, 15 pages.
Office Action for U.S. Appl. No. 12/945,087, mailed on Mar. 19, 2012, 6 pages.

\* cited by examiner

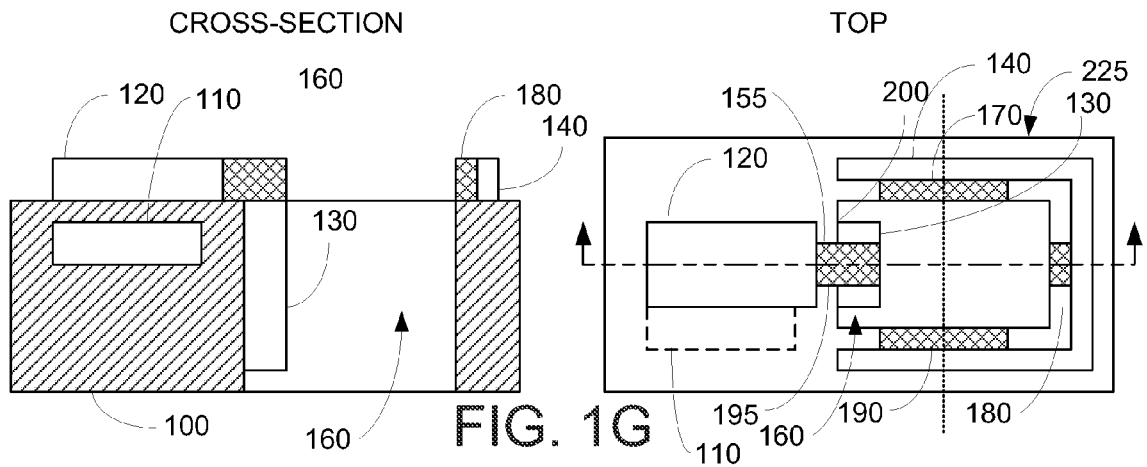
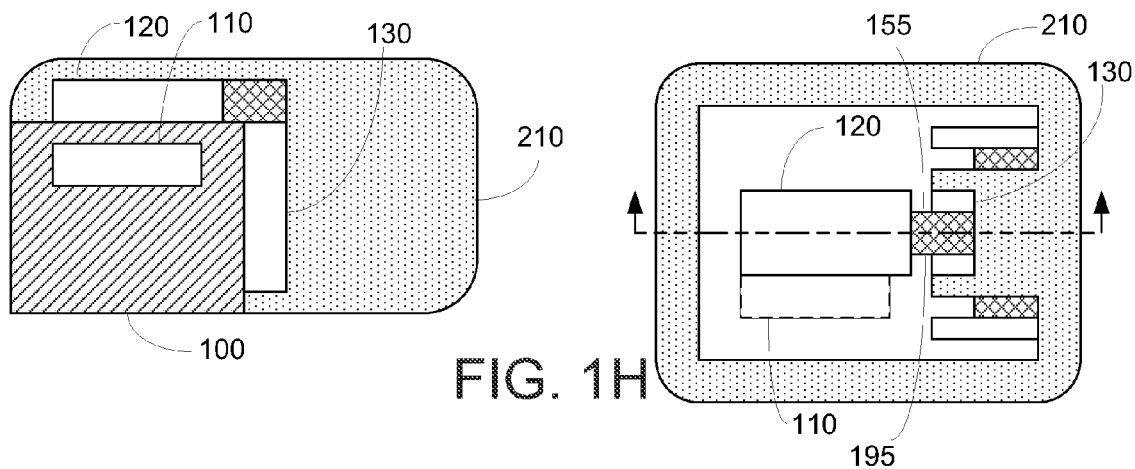
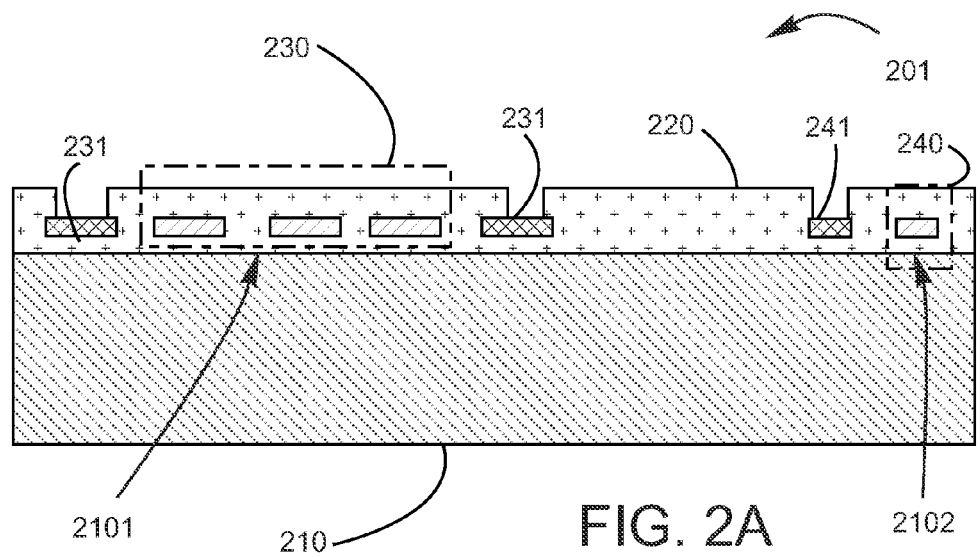

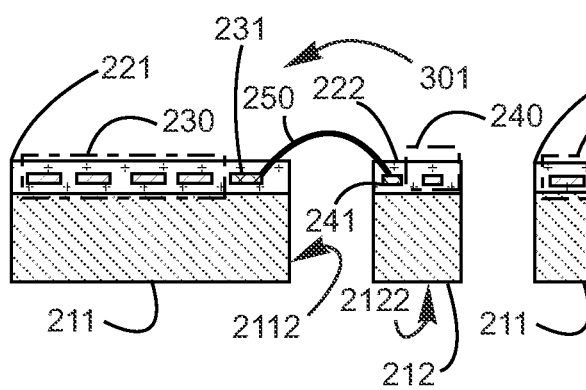
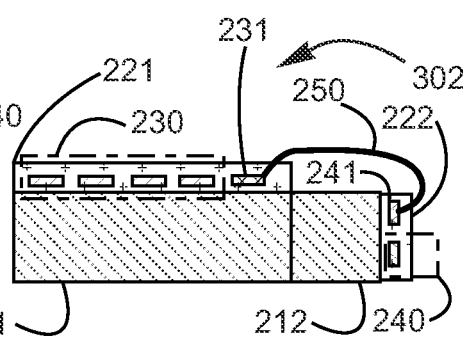
FIG. 3A    FIG. 3B
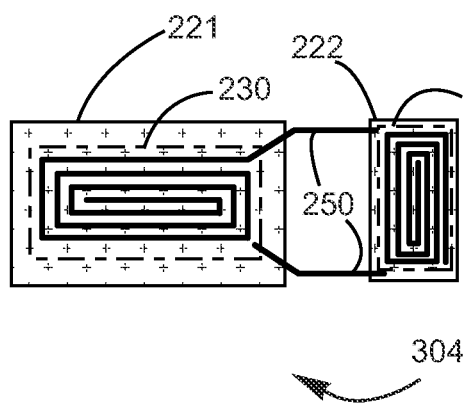
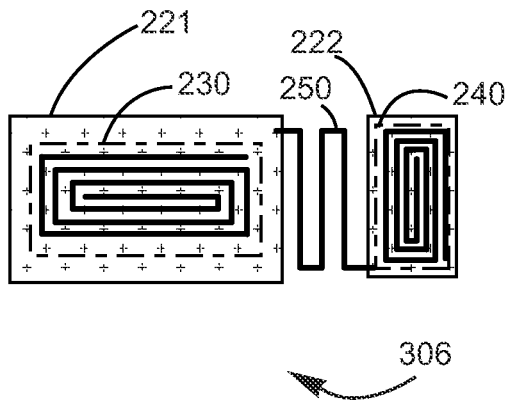
FIG. 3C    FIG. 3D

THREE AXIS MAGNETIC SENSOR DEVICE AND METHOD USING FLEX CABLES

The present invention incorporates by reference, for all purposes, the following co-pending patent applications: U.S. patent application Ser. No. 12/859,631, filed Aug. 19, 2010, U.S. patent application Ser. No. 12/490,067, filed Jun. 23, 2009, U.S. patent application Ser. No. 12/945,087, filed Nov. 12, 2010, and U.S. patent application Ser. No. 12/913,440, filed Oct. 27, 2010.

BACKGROUND OF THE INVENTION

The present invention relates generally to integrated circuit devices. In particular, the present invention provides a method and structure for fabricating a three-axis magnetic field sensing device. More specifically, embodiments of the present invention provide methods for forming at least one a first, second, and third magnetic field sensor element overlying an IC substrate member and coupled via one or more conductive cables. Merely by way of example, the magnetic field sensor elements can include anisotropic magneto-resistive (AMR) devices, giant magneto-resistive (GMR) device(s), tunnel junction magneto-resistive (TMR), or others. Additionally, other applications include at least a sensor application or magnetic field sensing applications, system applications, among others. But it will be recognized that the invention has a much broader range of applicability.

Research and development in integrated microelectronics have continued to produce astounding progress in CMOS, magnetic field sensors, and MEMS. CMOS technology has become the predominant fabrication technology for integrated circuits (IC). In layman's terms, microelectronic ICs are the "brains" of an integrated device which provides decision-making capabilities, whereas MEMS, magnetic field sensors, and others, are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC, magnetic field sensing, and MEMS technology has limitless applications through modular measurement devices such as accelerometers, angular rate sensors, transducers, actuators, and other sensors and devices. In conventional vehicles, accelerometers and angular rate sensors are used to deploy airbags and trigger dynamic stability control functions, respectively. Magnetic sensors are commonly used in compass systems, such as those used in aircrafts to determine heading, pitch and roll. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, health care and medical systems and the like. Magnetic sensors have also been used in applications requiring proximity switching, positioning, speed detection, current sensing and the like. As described previously, ICs, magnetic field sensors, and MEMS can be used to practically engage in various type of environmental interaction.

Although highly successful, ICs and in particular magnetic field sensors and MEMS still have limitations. Similar to IC development, magnetic sensor and MEMS development, which focuses on increasing performance, reducing size, and decreasing cost, continues to be challenging. Additionally, applications of magnetic sensors and MEMS often require increasingly complex microsystems that desire greater computational power. Unfortunately, such applications generally do not exist. These and other limitations of conventional magnetic sensors, MEMS, and ICs may be further described throughout the present specification and more particularly below.

From the above, it is seen that techniques for improving operation of integrated circuit devices, magnetic field sensors, and MEMS are highly desired.

BRIEF SUMMARY OF THE INVENTION

According to embodiments of the present invention, techniques generally related to integrated devices and systems are provided. In particular, embodiments of the present invention provide a method and structure for fabricating a three-axis magnetic field sensing device. More specifically, embodiments of the present invention provide methods for forming at least a first, second, and third magnetic field sensor element overlying an IC substrate member and coupled via one or more conductive cables. Merely by way of example, the magnetic field sensor elements can include anisotropic magneto-resistive (AMR) devices, giant magneto-resistive (GMR) device(s), tunnel junction magneto-resistive (TMR), or others. Additionally, other applications include at least a sensor application or magnetic field sensing applications, system applications, among others. But it will be recognized that the invention has a much broader range of applicability.

Embodiments of the present invention include a method including providing a substrate or SOI member having a first and second surface region. An IC layer having first bond pads and second bond pads can be formed overlying the substrate/SOI member with a first, second, and third magnetic sensing element coupled the IC layer. The first and second magnetic sensing can be disposed overlying the first surface region, while the third magnetic sensing element can be disposed overlying the second surface region. One or more conductive cables can be formed to couple the first and second bond pads of the IC layer. A portion of the substrate member and IC layer can be removed to separate the first and second magnetic sensing elements on a first substrate member from the third sensing element on a second substrate member, and the third sensing element can be coupled to the side-wall of the first substrate member.

Embodiments of the device can have a first IC substrate member with a first and second magnetic field sensing element spatially disposed overlying a first surface region. A second IC substrate member with a third magnetic field sensing element can be coupled to the side-wall of the first IC substrate member. The first IC substrate member can have one or more first bond pads that are coupled to one or more second bond pads on the second IC substrate member via one or more conductive cables. Those skilled in the art will recognize other variations, modifications and alternatives.

Many benefits are achieved by way of embodiments the present invention over conventional techniques. For example, embodiments of the present technique provide an easy to use process to integrate a three-axis magnetic field sensor on a single die. In some embodiments, the method provides higher device yields in dies per wafer with the integrated approach. Additionally, the method provides a process and system that are compatible with conventional semiconductor and MEMS process technologies without substantial modifications to conventional equipment and processes. Preferably, the invention provides for an improved magnetic field sensor or magnetic field sensor device system and related applications for a variety of uses. Depending upon the embodiment, one or more of these benefits may be achieved. These and other benefits will be described in more throughout the present specification and more particularly below.

Various additional embodiments, features, and advantages of the present invention can be more fully appreciated with reference to the detailed description and accompanying drawings that follow.

BRIEF DESCRIPTION OF THE DRAWINGS

The following diagrams are merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIGS. 1A-1H illustrate a simplified process flow diagram according to various embodiments of the present invention;

FIGS. 2A-2E illustrate a simplified process flow diagram according to various embodiments of the present invention;

FIGS. 3A-3D illustrate simplified side and top views of a magnetic sensing device according to various embodiments of the present invention;

DETAILED DESCRIPTION OF THE INVENTION

Embodiments of the present invention provide techniques generally related to integrated devices and systems. In particular, embodiments of the present invention provide methods and structures for a three-axis magnetic field sensing device using flex cables. More specifically, embodiments of the present invention provide methods for monolithically forming at least a first, second, and third magnetic field sensor element overlying an IC substrate member and coupled via one or more conductive cables. Merely by way of example, the magnetic field sensor elements can include anisotropic magneto-resistive (AMR) devices, giant magneto-resistive (GMR) device(s), tunnel junction magneto-resistive (TMR), or others. Additionally, other applications include at least a sensor application or magnetic field sensing applications, system applications, among others. But it will be recognized that the invention has a much broader range of applicability.

Figure 1A:
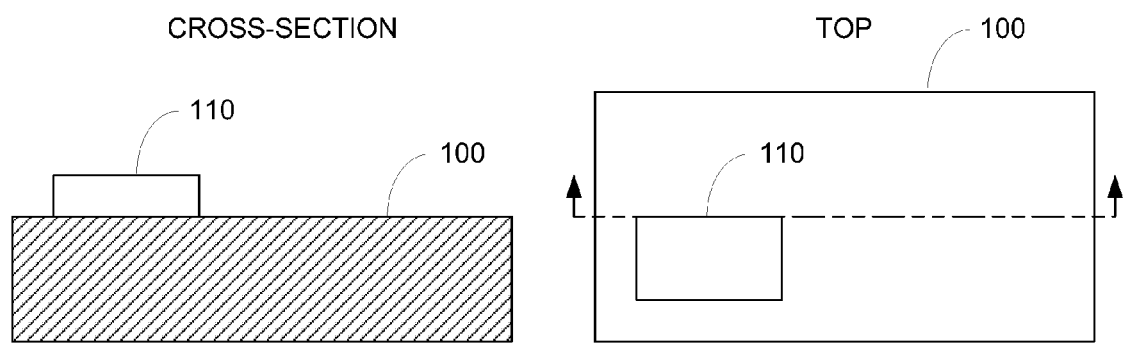

FIGS. 1A-1H illustrate a process flow diagram according to various embodiments of the present invention. Initially, FIG. 1A illustrates a top view and a cross-section view of a typical base substrate 100. In various embodiments, substrate 100 may be silicon substrate, silicon on insulator, epitaxial silicon, or the like.

In various embodiments, a CMOS device 110 is fabricated upon substrate 100 using standard foundry-compatible CMOS processing steps. In various embodiments, CMOS device 110 may include processing circuitry, logic, memory, and the like. In some embodiments, an ASIC, or other device may be fabricated. These ASIC or control devices may be used to process data from one or more MEMS sensors, described below.

Figure 1B:
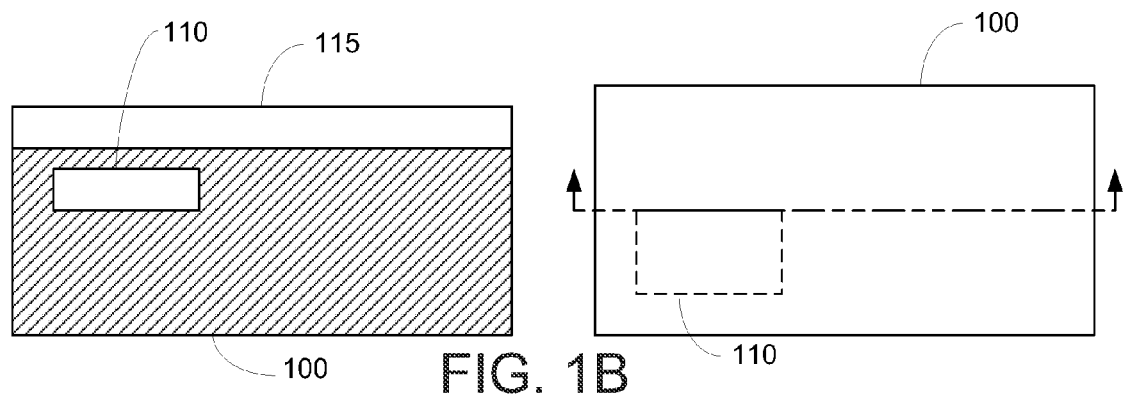

In FIG. 1B, a layer 115 is bonded to CMOS device 110. In various embodiments, layer 115 may be silicon and/or include one or more vias connecting to CMOS device 110. As disclosed in the above-referenced applications, layer 115 may be bonded upon substrate 100 and CMOS device 110 by a low temperature bonding (e.g. fusion) process, or the like.

Figure 1C:
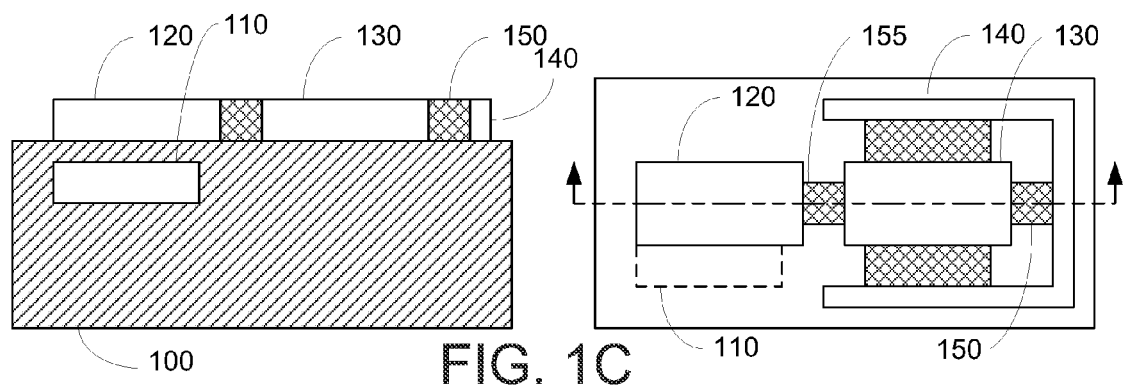

As illustrated in the embodiment in FIG. 1C, a one or more MEMS sensors, e.g. MEMS 120 and 130 may be fabricated within layer 115, on top of CMOS device 110. As can be seen, MEMS sensors 120, 130, or the like are formed upon the same substrate, layer 115, i.e. monolithically.

In various embodiments, MEMS 120 and 130 are formed from a CMOS foundry-compatible process. In some embodiments, MEMS 120 and 130 may be a physical perturbation sensors such as accelerometers, gyroscopes, pressure sensors, magnetic sensors, tilt sensors, or the like. In the example in FIG. 1C, MEMS 120 is a two-axis (e.g. x-y axis) magnetometer, and MEMS 130 is a single-axis magnetometer. In the configuration illustrated in FIG. 1C, MEMS 130 may be in an x-axis or y-axis magnetometer.

In FIG. 1C, one or more anchoring structures (e.g. anchoring structure 140) may be provided that may partially or completely surround MEMS 130. In various embodiments, anchoring structure 140 may physically be coupled to MEMS 130 via a MEMS structure 150, or the like. In various embodiments, structures 150 may resemble MEMS spring structures often used in MEMS based accelerometers, gyroscopes, or the like. In various embodiments, structure 150 need not be as robust as typical MEMS spring structures, and may have weaker or thinner regions for the reasons described below. As shown, MEMS 130 is typically electrically coupled to MEMS 120 via one or more conductors 155.

Figure 1D:
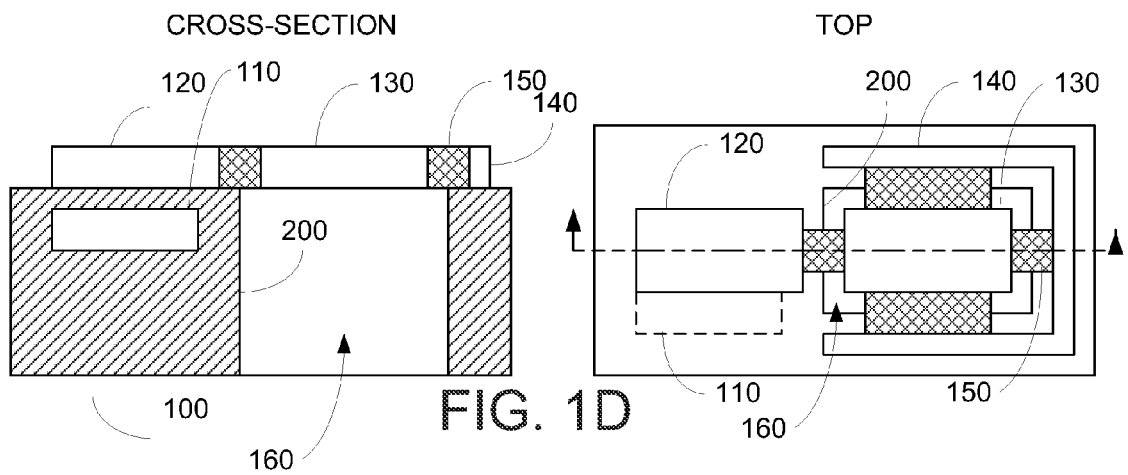
Figure 1E:
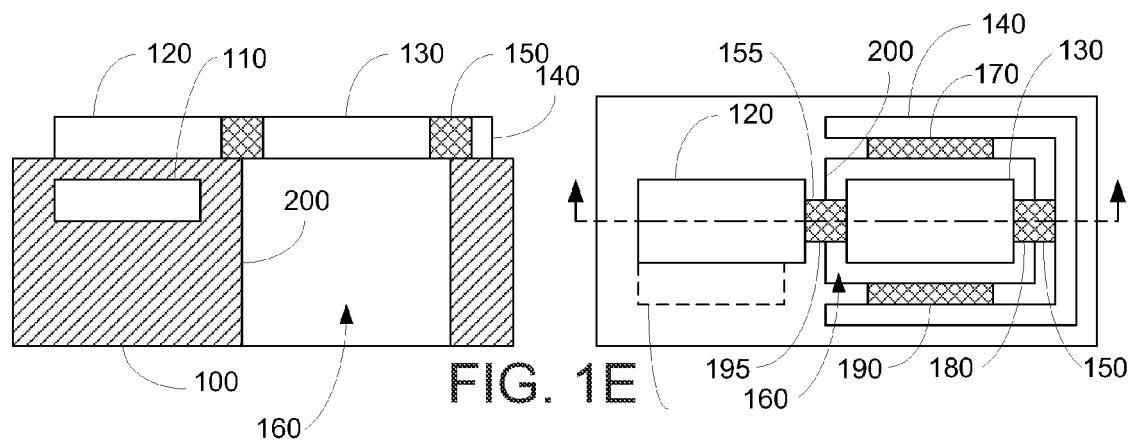

In various embodiments, as illustrated in FIG. 1D, using a etch process, a channel 160 is formed through substrate 100. In various embodiments, the etch is performed on the back side of semiconductor substrate 100. In some embodiments, a deep reactive ion etch (DRIE) process is used to enable formation of the vertical walls 200, as illustrated. In other embodiments, other etching processes may also be utilized to form a channel 160.

In the top view in FIG. 1D, it can be seen that the etch process is performed such that the semiconductor substrate below MEMS 130 is removed. In such examples MEMS 130 is thus suspended within channel 160 by MEMS structures 150. More specifically, as illustrated in the example in FIG. 1E, MEMS structures 170, 180, 190, and 195 physically couple or connect MEMS 130 to anchoring structure 140. In other embodiments, a fewer number of MEMS structures may support MEMS 130, for example, MEMS structures 170 and 190 may not be used.

Figure 1F:
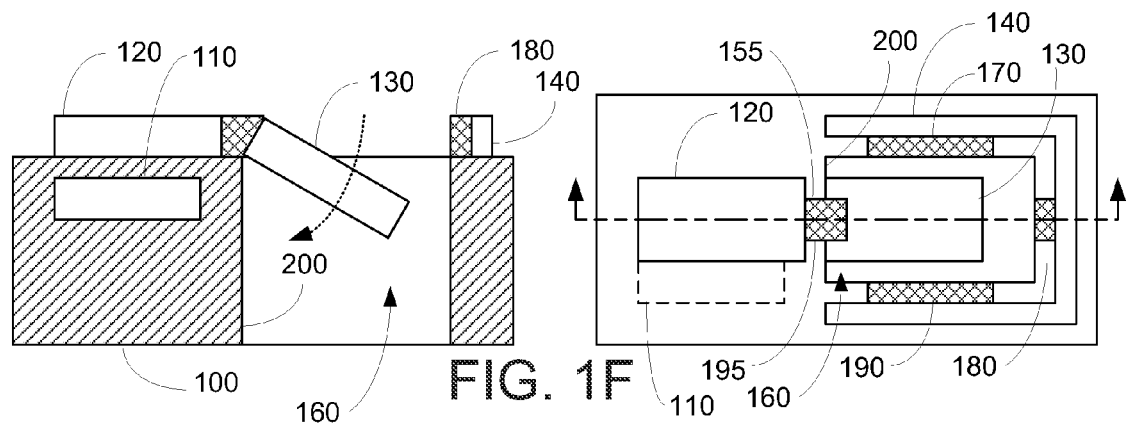

In various embodiments, as illustrated in the example in FIG. 1F, certain supporting MEMS structures 150 may be cut or severed. For example, MEMS structures 170, 180, and 190 are cut, removed, or eliminated such that anchoring structure 140 and MEMS 130 are totally or partially separated, as illustrated. In various embodiments, the severing may be performed by physical probe, via sonic waves, electrically (e.g. fuse structure), or the like. As shown in the side-view of FIG. 1F, once MEMS structures 170, 180, 190 are severed, under the weight of gravity, or the like, MEMS 130 may tend to sag or bend within channel 160 towards sidewall 200.

In the example illustrated in FIG. 1G, MEMS 130 may be bent further into channel 160, such that MEMS 130 contacts sidewall 200. In various embodiments, a directed stream of air, or the like may be used to urge MEMS 130 towards sidewall 200. Subsequently, various mechanisms may be used to secure MEMS 130 to sidewall 200, such as an epoxy, glue, physical spacer, or the like.

In various embodiments, it is noted that the electrical connections 155 between MEMS 130 and 120 are typically maintained even when MEMS 130 is secured to sidewall 200. In some embodiments, conductors 155 and structures 195 may be combined or integrated into a single flexible cable-type or connector-type structure. Examples of this are illustrated in various embodiments described below.

In such a configuration, the axis of sensing of MEMS 130 is changed from the x or y axis to the z axis. For example, MEMS 130 becomes a z-axis magnetometer, while MEMS 120 remains x and y-axis magnetometers. Accordingly, embodiments of the present invention disclose a mechanism for forming a monolithic three-axis magnetometer.

In various embodiments, a portion of the semiconductor substrate 225 may be subsequently removed, as shown in FIG. 1H. For example, it is contemplated that portion 225 may be sawed-off, ground-off, etched-away, or the like. In such embodiments, channel 160 would then be opened-up, thus facilitating the use of a stream of directed air against MEMS 130, as discussed above. In other embodiments, substrate 225 need not be removed.

In various embodiments, a number of additional semiconductor processing steps and layers may be disposed, as illustrated in FIG. 1H. For example, one or more conductive layers or structures may be used, one or more passivation layers may be disposed, one or more encapsulation layers 210, or the like may be formed. In various embodiments, it is envisioned that an encapsulation layer 210 would be disposed within open channel 160. Such embodiments would help maintain the orientation of MEMS 130 in the vertical direction against sidewall 200 during subsequent usage of the device. Those skilled in the art will recognize other variations, modifications, and alternatives.

Figure 2B:
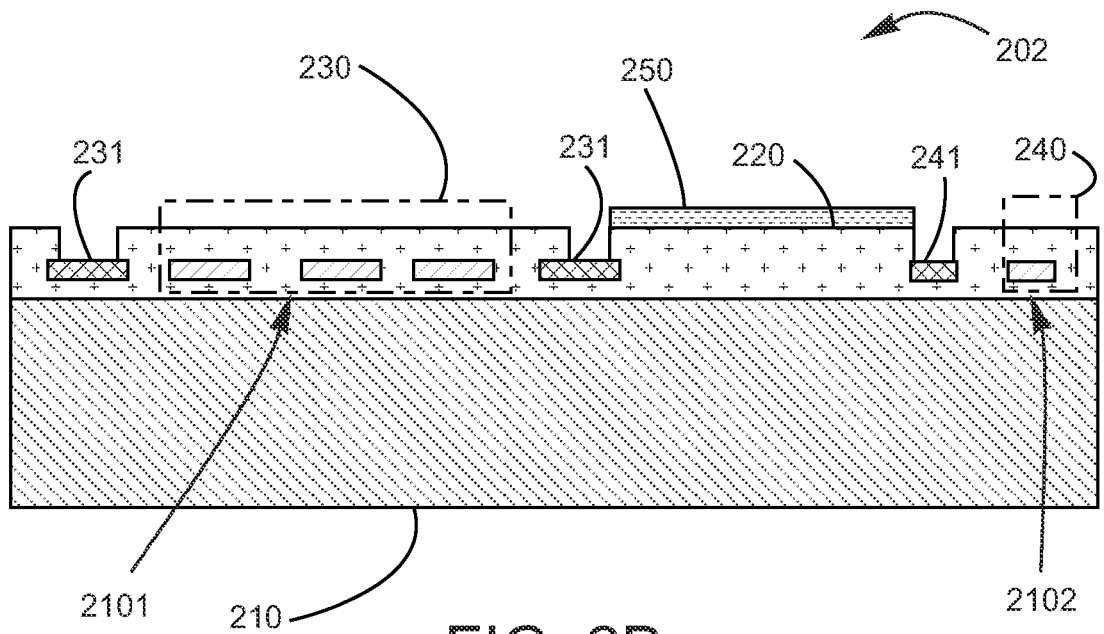

FIGS. 2A-2E illustrate a simplified process flow diagram according to various other embodiments of the present invention. Similar to FIG. 1C, FIG. 2A illustrates a side view of a magnetic sensing device 201 having a base substrate 210 with one or more MEMS 230 and 240 formed layer 220, which may be silicon and/or include one or more first bond pads 231 and one or more second bond pads 241 that connect to an embedded IC layer within substrate 210. As shown, one or more MEMS 230 and 240 can be formed integrally within layer 220, wherein MEMS 230 is formed overlying a first surface region 2101 of substrate 210 and MEMS 240 is formed overlying a second surface region 2102 substrate 210.

In a specific embodiment, MEMS 230 can include a first magnetic field sensing element and a second magnetic field sensing element while MEMS 240 can include a third magnetic field sensing element. The first, second, and third magnetic field sensing elements can include anisotropic magneto-resistive (AMR) devices, giant magneto-resistive (GMR) devices, tunnel junction magneto-resistive (TMR) devices, or other magneto-resistive devices, and the like. Also, these magneto-resistive devices can be thin film devices that are deposited overlying substrate 210. In various embodiments, MEMS 230 and 240 can include other MEMS sensors such as accelerometers, gyroscopes, pressure sensors, and the like.

FIG. 2B illustrates the forming of a first cable insulator material 250 overlying layer 220 between at least one of the bond pads 231 and at least one of the bond pads 241. First cable insulator material 250 can be a parylene material, a dielectric material, or other like insulating material, which may be masked and etched using standard fabrication processes to insulate the region between bond pads 231 and 241. In a specific embodiment, a PR mask may be used with an $O_2$ plasma etch. In various embodiments, a vapor prime adhesion promoter may be applied prior to the deposition of insulator material 250.

Figure 2C:
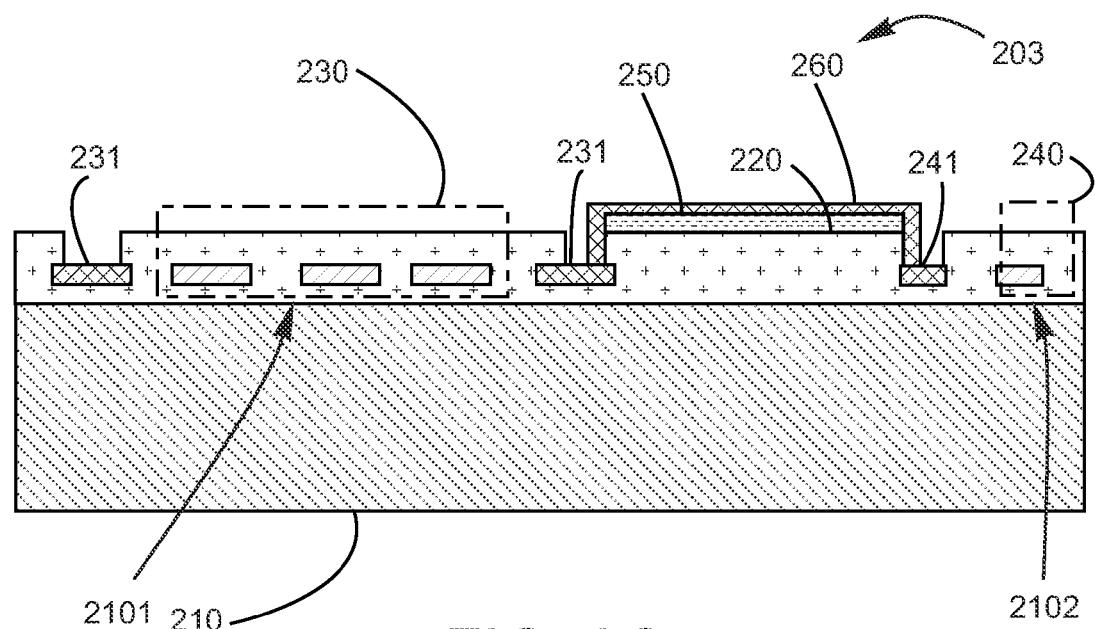

FIG. 2C illustrates the forming of a metal or metal allow material 260 overlying the first cable insulator material 250. In a specific embodiment, metal material 260 can be an aluminum material deposited and patterned with an aluminum etch to protect the bond pads 231 and 241. Also, metal material 260 can be formed as one or more conductive cables coupling at least one of the first bond pads 231 and at least one of the second bond pads 241.

Figure 2D:
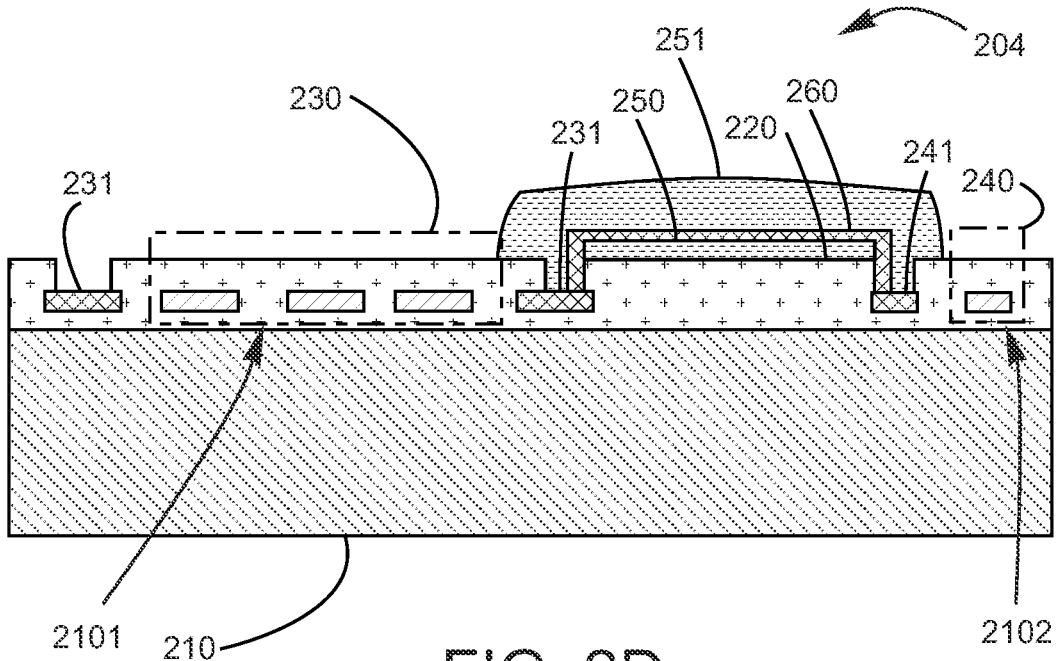

FIG. 2D illustrates the forming of a second cable insulator material 251 overlying metal material 260 and first cable insulator material 250. Second insulator material 251 can include similar materials as first insulator material 250 and be processed using similar standard fabrication processes. Additionally, first and second cable insulator material 250 and 251 can be annealed post-etching.

Figure 2E:
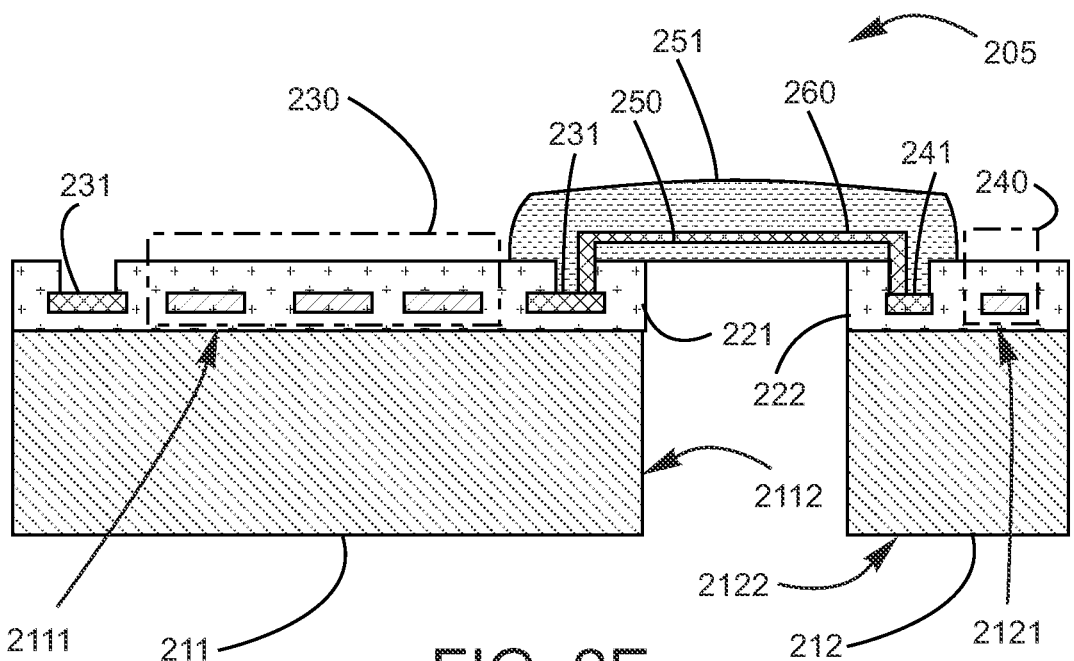

FIG. 2E illustrates the removal of a portion of substrate 210 and layer 220, which may be a portion below metal material 260 and cable insulator materials 250 and 251. The removal can separate a second portion of the substrate 211 from a third portion of the substrate 212 and can also separate a second portion of the IC layer 221 from a third portion of the IC layer 222. The second portion of the substrate 221 can have a first surface region 2111 and a second surface region 2112. The third portion of the substrate 212 can have a first surface region 2121 and a second surface region 2122. This portion can removed via an etching process, such as a backside deep-reactive ion etching (DRIE) process or the like. In a specific embodiment, the backside DRIE process isolates MEMS 230 and 240 such that they are connected via the one or more conductive cables. Of course, there can be variations, modifications, and alternatives.

FIGS. 3A-3D illustrate simplified side and top views of a magnetic sensing device according to various embodiments of the present invention. FIG. 3A shows device 301, which is similar to device 205 of FIG. 2E. Here, conduction cable 250 couples a first IC-MEMS device comprising substrate 211, silicon layer 221, MEMS 230, and bond pad 231 to a second IC-MEMS device comprising a substrate 212, MEMS 240, a silicon layer 222, and bond pad 241. FIG. 3B shows device 302, wherein the second IC-MEMS device is flipped and mounted to the side-wall of the first IC-MEMS device. The second surface region 2122 of the third portion of the substrate 212 can be coupled to the second surface region 2112 of the second portion of the substrate 211. In a specific embodiment, the second IC-MEMS device can be flipped 90 degrees and glued to the side-wall of the first IC-MEMS device. FIG. 3B illustrates a method of forming a 3-axis magnetic field sensing device, particularly by configuring the second IC-MEMS device to detect magnetic fields via vertical mounting. In various embodiments, MEMS 230 may include x-axis, y-axis, or xy-axis magnetic sensor while MEMS 240 may be flipped to become a z-axis magnetic sensor. Other variations, modifications, and alternatives will be recognized by those skilled in the art.

FIGS. 3C and 3D illustrate two embodiments of one or more conductive cables 250. FIG. 3C shows two conductive cables formed in parallel, coupling two pairs of bond pads between the two separate IC-MEMS devices. On the other hand, FIG. 3D shows a single conductive cable formed in a coil or spring configuration, coupling a pair of bond pads between the two separate IC-MEMS devices. In various embodiments, either configuration can include additional conductive cables formed in a parallel, spring, or like configuration.

Figures 4A, 4B:
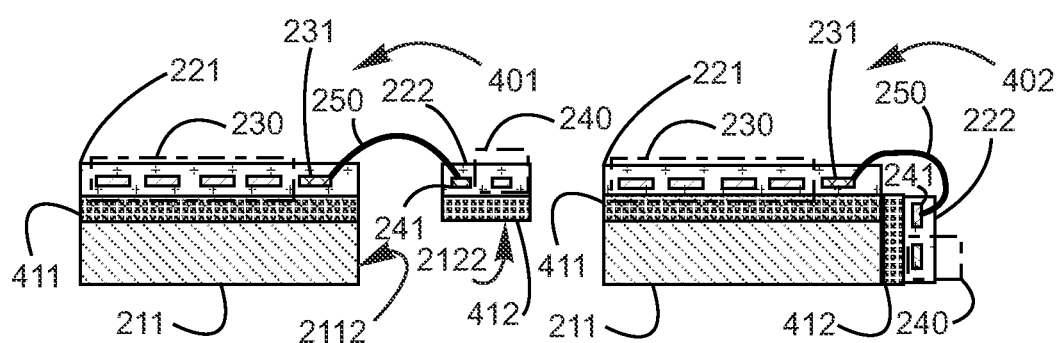
FIGS. 4A-4D illustrate simplified side and top views of a magnetic sensing device according to various embodiments of the present invention.
Figures 4C, 4D:
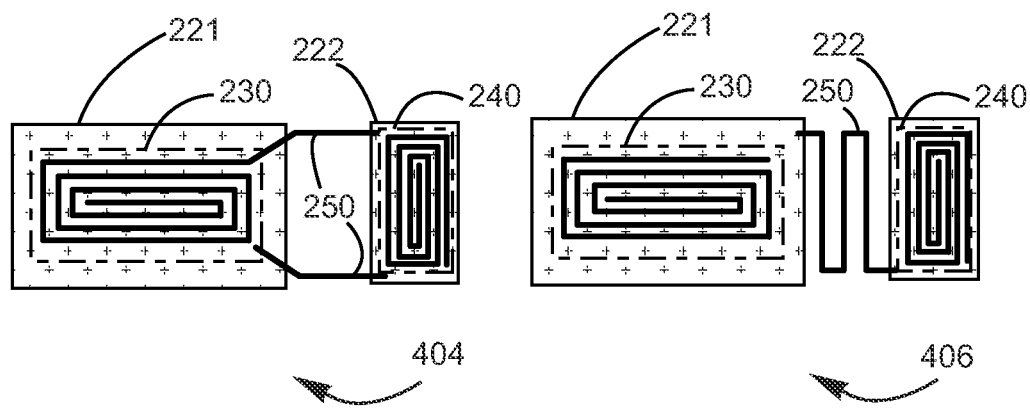

FIGS. 4A-4D illustrate simplified side and top views of a magnetic sensing device according to various embodiments of the present invention. FIG. 4A shows device 401, wherein the substrate 211 is a substrate-on-insulator (SOI) member having an insulator layer 411 formed overlying and substrate 212 is also a SOI member having an insulator layer 412 formed overlying. Insulator layer 411 and 412 can include a dielectric material, such as an oxide material, or the like. In a specific embodiment, layer 412 can act as a DRIE process stop for the second IC-MEMS device. Thus, MEMS 240 may be separated from the bulk silicon of substrate 210. Similar to device 302 of FIG. 3B, the second IC-MEMS device can be flipped and mounted on the side-wall of the first IC-MEMS device as shown in device 402 of FIG. 4B. The second surface region 2122 of the third portion of the SOI member 212 can be coupled to the second surface region 2112 of the second portion of the SOI member 211. This method can give the benefit of a reduced overall chip size. As shown previously, FIGS. 4C and 4D depict various embodiments of the conductive cable configurations similar to FIGS. 3C and 3D.

Figures 5A, 5B:
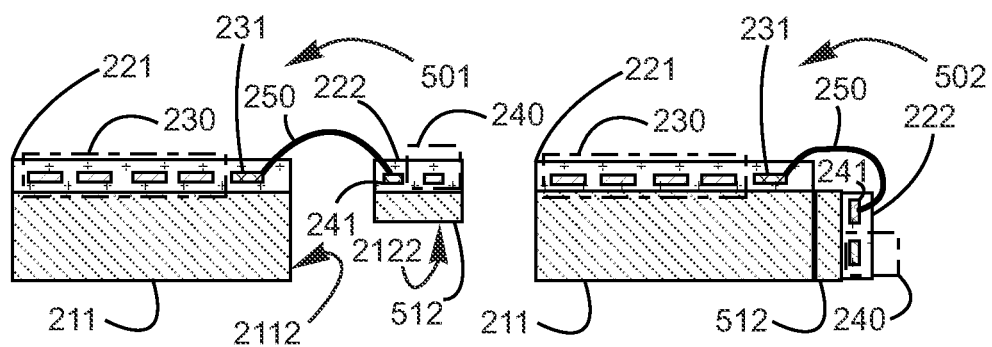
FIGS. 5A-5D illustrate simplified side and top views of a magnetic sensing device according to various embodiments of the present invention.
Figures 5C, 5D:
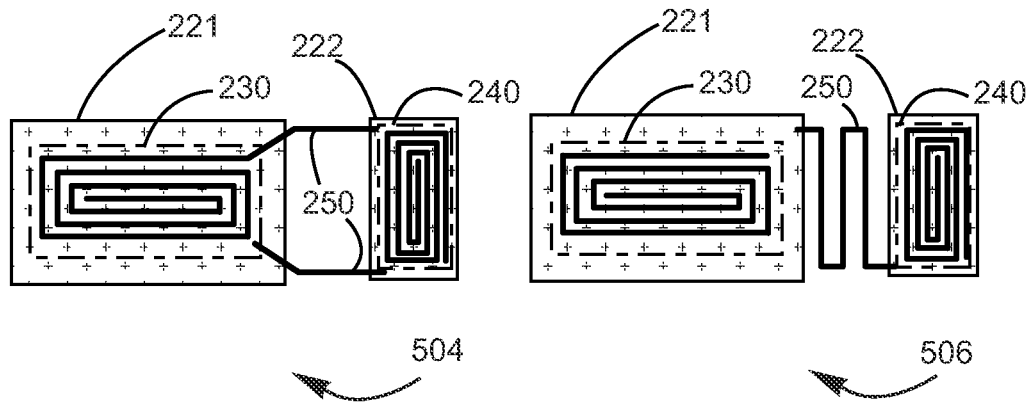

FIGS. 5A-5D illustrate simplified side and top views of a magnetic sensing device according to various embodiments of the present invention. FIG. 5A shows device 501, wherein a depth controllable DRIE process can be used to remove a portion of substrate 212 to a desired thickness 512. Similarly, the second IC-MEMS device can be flipped and mounted on the side-wall of the first IC-MEMS device as shown in device 502 of FIG. 5B. The second surface region 2122 of the third portion of the substrate 212 can be coupled to the second surface region 2112 of the second portion of the substrate 211. This method can also give the benefit of a reduced overall chip size without requiring an SOI member. As shown previously, FIGS. 5C and 5D depict various embodiments of the conductive cable configurations. Those skilled in the art will recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIG. 6A-6D illustrate simplified process flow diagrams of a method for fabricating a device for sensing magnetic fields according to an embodiment of the present invention. For illustrative purposes only, reference to elements in previous figures may be provided in the discussion below merely for the sake of convenience.

Figure 6A:
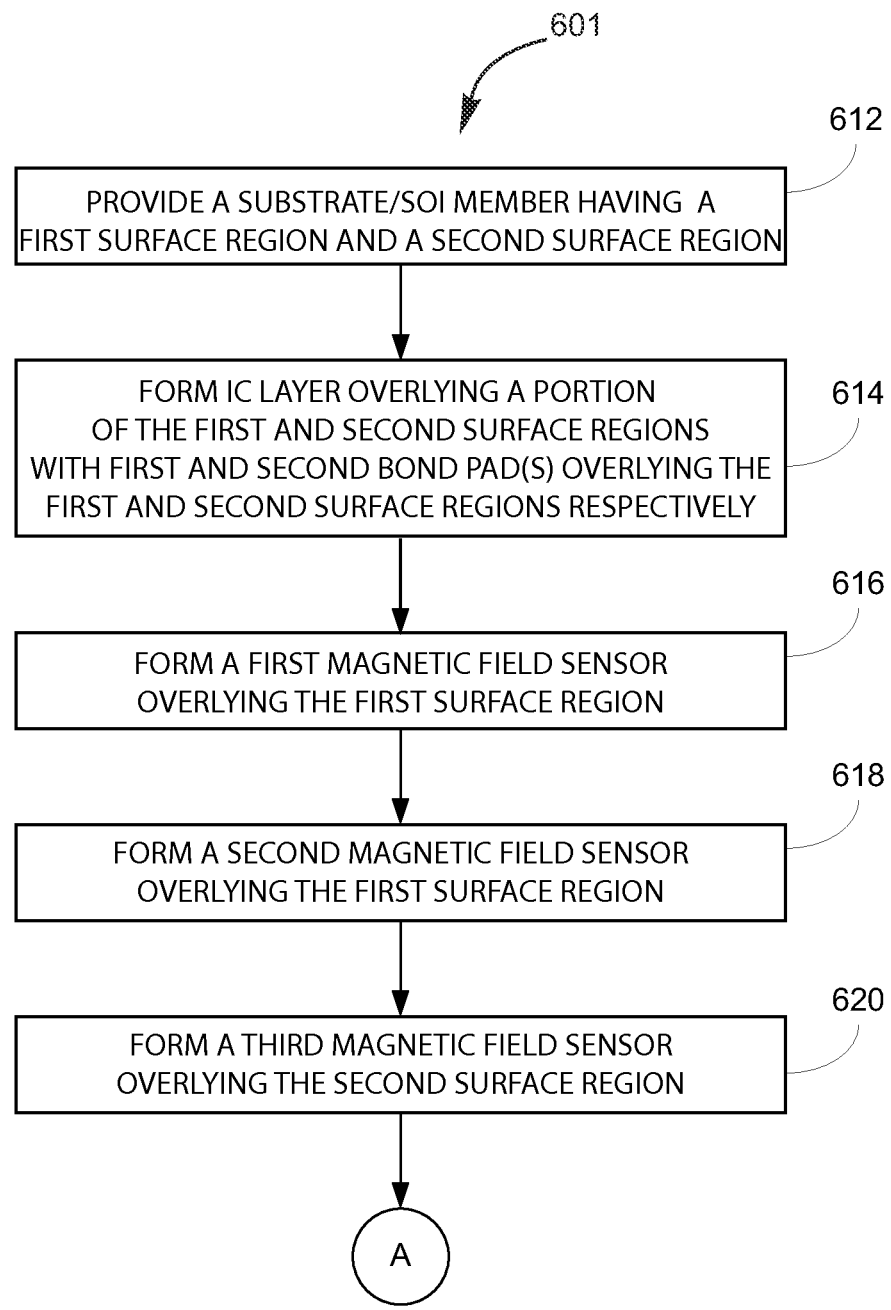
FIG. 6A-6D illustrate simplified process flow diagrams of a method for fabricating a device for sensing magnetic fields according to an embodiment of the present invention.
Figure 6B:
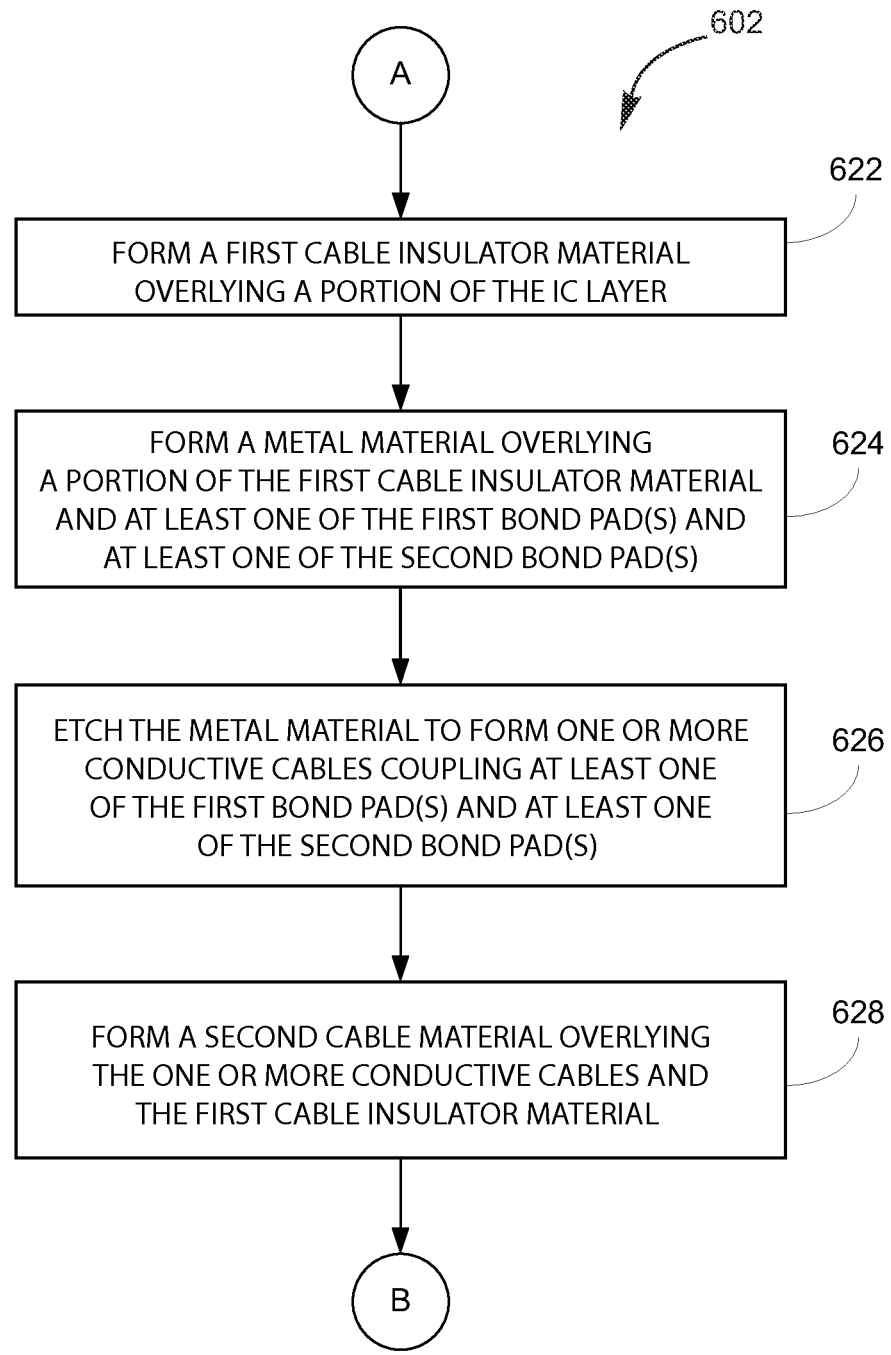
Figure 6C:
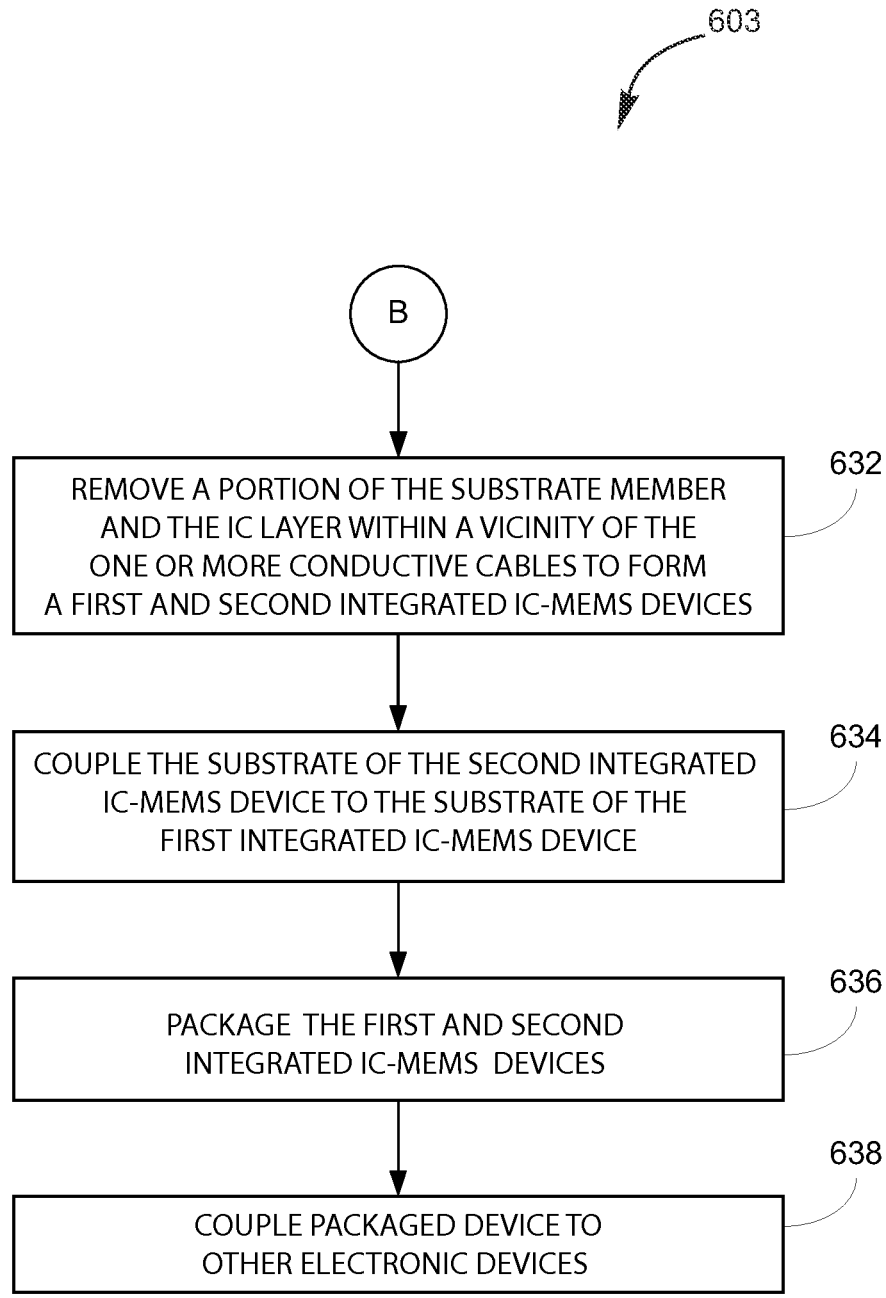

As shown in FIGS. 6A-6C, an embodiment of the present method can be briefly outlined below.
1. Provide a substrate/SOI member having a first surface region and a second surface region;
2. Form an IC layer overlying a portion of the first surface region and a portion of the second surface region of the substrate member, the IC layer having one or more first bond pads formed overlying the first surface region and one or more second bond pads formed overlying the second surface region;
3. Form a first magnetic field sensor element operably coupled to the IC layer, the first magnetic field sensor element being disposed overlying the first surface region and being configured to detect at least a first direction;
4. Form a second magnetic field sensor element operably coupled to the IC layer, the second magnetic field sensor element being disposed overlying the first surface region and being configured to detect at least a second direction;
5. Form a third magnetic field sensor element operably coupled to the IC layer, the third magnetic field sensor element being disposed overlying the second surface region and being configured to detect at least a third direction;
6. Form a first cable insulator material overlying at least a portion of the IC layer;
7. Form a metal or metal alloy material overlying at least a portion of the first cable insulator material and at least one of the first bond pads and at least one of the second bond pads;
8. Etch the metal or metal alloy material to from one or more conductive cables coupling at least one of the first bond pads and at least one of the second bond pads;
9. Form a second cable insulator material overlying the one or more conductive cables and the first cable insulator material;
10. Remove a first portion of the substrate/SOI member and the IC layer within a vicinity of the one or more conductive cables, thereby separating a second portion of the substrate/SOI member from a third portion of the substrate/SOI member, and separating a second portion of the IC layer from a third portion of the IC layer;
11. Couple the third portion of the substrate/SOI member to the second portion of the substrate/SOI member;
12. Package the resulting device; and
13. Couple the packaged resulting device to other electronic devices.

These steps are merely examples and should not unduly limit the scope of the claims herein. As shown, the above embodiment of a method provides a fabrication process for an integrated IC-MEMS device. One of ordinary skill in the art would recognize many other variations, modifications, and alternatives. For example, various steps outlined above may be added, removed, modified, rearranged, repeated, and/or overlapped, as contemplated within the scope of the invention.

Embodiments of the present method provide a fabrication method for forming an integrated magnetic field sensing device using flex cables or flex elements. Many benefits are achieved by way of embodiments the present invention over conventional techniques. For example, embodiments of the present technique provide an easy to use process to integrate a three-axis magnetic field sensor on a single die. In some embodiments, the method provides higher device yields in dies per wafer with the integrated approach. Additionally, the method provides a process and system that are compatible with conventional semiconductor and MEMS process technologies without substantial modifications to conventional equipment and processes. Preferably, the invention provides for an improved magnetic field sensor or magnetic field sensor device system and related applications for a variety of uses. Depending upon the embodiment, one or more of these benefits may be achieved.

As shown in FIG. 6A, method 601 begins with providing a substrate, epitaxial silicon, or SOI member having a first surface region and a second surface region, step 612. In an embodiment, the substrate member can include one or more silicon materials, including monocrystalline, polycrystalline, and amorphous silicon materials. In the case the SOI member is used, a substrate with a dielectric layer comprising an oxide material or like materials can be used. Air gaps may also be used to form air dielectric regions within the SOI member. Also, the first and second surface regions of the substrate may be allocated symmetrically or asymmetrically, depending on fabrication needs.

An IC layer can be formed overlying a portion of the first surface region and a portion of the second surface region of the substrate member, step 614. The IC layer may have one or more first bond pads overlying the first surface region and one or more second bond pads overlying the second surface region. In an embodiment, the IC layer can be formed using standard IC fabrication processes, and can include CMOS circuitry, logic circuitry, control circuitry, and the like. The IC layer may also be an ASIC layer, which can be used to interface with one or more physical sensors and/or MEMS devices.

A first, second, and third magnetic field sensor element can be formed overlying the IC layer. In an embodiment, both the first and second magnetic field sensor elements can be formed overlying a portion of the first surface region, steps 616 and 618, whereas the third magnetic field sensor element can be formed overlying a portion of the second surface region, step 620. These sensor elements can include magneto-resistive elements such as anisotropic magneto-resistive (AMR) devices, giant magneto-resistive (GMR) devices, or tunnel junction magneto-resistive (TMR) devices, and the like. The sensor elements can also include thin film sensor devices that may be deposited via sputtering, vapor deposition, or other like processes. In various embodiments, the first, second, and third magnetic field sensor elements may be formed as Wheatstone bridges, half bridges, or single elements. Additionally, these magnetic field sensor elements may be fabricated in conjunction with one or more MEMS sensors, or replaced by one or more MEMS sensors, depending on the application. These MEMS sensors can include a variety of inertial sensors, pressure sensors, bio-chemical sensors, and the like. Further details regarding the IC layer, MEMS devices, and magnetic field sensor devices can be found above in the descriptions for FIGS. 1B, 1C, and 2A.

As shown in FIG. 6B, method 601 can proceed to method 602 wherein one or more conductive cables or straps can be formed such that these cables couple at least one of the first bond pads and at least one of the second bond pads of the IC layer. In a specific embodiment, a first cable insulator material can be formed overlying at least a portion of the IC layer, step 622. This portion can be located between the first and second surface regions of the substrate member. A metal or metal alloy material can be formed overlying at least a portion of the first cable insulator material, step 624. The metal material can be etched to form one or more conductive cables coupling at least one of the first bond pads and at least one of the second bond pads, step 626. A second cable insulator material can be formed overlying the one or more conductive cables and the first cable insulator material, step 628. Those skilled in the art will recognize other variations, modifications, and alternatives to the formation of such conductive cables or "flex" cables. Further details can be found in the description above for FIGS. 2B-2D.

An embodiment of the present method can be shown by method 603 shown in FIG. 6C. A first portion of the substrate member and the IC layer can be removed within a vicinity of the one or more conductive cables or elements, step 632. This step is similar to the process shown in FIG. 2E. This step may be used to form a first integrated IC-MEMS member and a second integrated IC-MEMS member. The first IC-MEMS member can include a second portion of the substrate/SOI member and a second portion of the IC layer, which includes the one or more first bond pads. The second IC-MEMS member can include a third portion of the substrate/SOI member and a third portion of the IC layer, which includes the one or more second bond pads. The first integrated IC-MEMS member can have a first surface region and a second region, wherein the first surface region includes at least a part of the first surface region of the original substrate/SOI member. Similarly, the second integrated IC-MEMS member can have a first and second surface region, wherein the first surface region includes at least a part of the second surface region of the original substrate/SOI member. The second portion of the IC layer may be configured above the first surface region of the second portion of the substrate/SOI member and the third portion of the IC layer may be configured above the first surface region of the third portion of the substrate/SOI member.

In an embodiment, the removal of the first portion of the substrate can form the second surface region associated with the first substrate member, and isolate the second surface region, associated with the substrate member. In a specific embodiment, the second surface region of the second portion of the substrate/SOI member can be a side-wall region of the first IC-MEMS member, and the second surface region of the third portion of the substrate/SOI member can be the underside region of the second IC-MEMS member. Also, the one or more conductive cables can electrically couple the first and second IC layers via the first and second bond pads. In an embodiment, the conductive cables form the only interconnections between the first and second IC-MEMS members. Of course, there can be other variations, modifications, and alternatives.

Following the removal of the portion of the substrate and the IC layer, the second substrate member can be coupled to the first substrate member, step 634. Particularly, the second surface region of the third portion of the substrate/SOI member can be coupled to the second surface region of the second portion of the substrate/SOI member. In a specific embodiment, the second IC-MEMS member can be rotated and vertically mounted on the side-wall of the first IC-MEMS member. Further details of this mounting process can be found in the description for FIGS. 3A-3D and 5A-5D. The resulting device may be packaged, step 636, and coupled to other electronic devices, step 638. The packaging material can include encapsulating epoxy materials, physical capping layers, or the like.

Replacing FIG. 6C with 6D depicts another embodiment of the present method outlined below.

1. Provide a SOI member having a first surface region and a second surface region;
2. Form an IC layer overlying a portion of the first surface region and a portion of the second surface region of the substrate member, the IC layer having one or more first bond pads formed overlying the first surface region and one or more second bond pads formed overlying the second surface region;
3. Form a first magnetic field sensor element operably coupled to the IC layer, the first magnetic field sensor element being disposed overlying the first surface region and being configured to detect at least a first direction;

4. Form a second magnetic field sensor element operably coupled to the IC layer, the second magnetic field sensor element being disposed overlying the first surface region and being configured to detect at least a second direction;
5. Form a third magnetic field sensor element operably coupled to the IC layer, the third magnetic field sensor element being disposed overlying the second surface region and being configured to detect at least a third direction;
6. Form a first cable insulator material overlying at least a portion of the IC layer;
7. Form a metal or metal alloy material overlying at least a portion of the first cable insulator material and at least one of the first bond pads and at least one of the second bond pads;
8. Etch the metal or metal alloy material to from one or more conductive cables coupling at least one of the first bond pads and at least one of the second bond pads;
9. Form a second cable insulator material overlying the one or more conductive cables and the first cable insulator material;
10. Remove a first portion of the SOI member and the IC layer within a vicinity of the one or more conductive cables, thereby separating a second portion of the SOI member from a third portion of the SOI member wherein the third portion of the SOI member has the silicon substrate removed from the insulator layer, and separating a second portion of the IC layer from a third portion of the IC layer;
11. Couple the second insulation member to the substrate member;
12. Package the resulting device; and
13. Couple the packaged resulting device to other electronic devices.

These steps are merely examples and should not unduly limit the scope of the claims herein. As shown, the above embodiment of a method provides a fabrication process for an integrated IC-MEMS device. One of ordinary skill in the art would recognize many other variations, modifications, and alternatives. For example, various steps outlined above may be added, removed, modified, rearranged, repeated, and/or overlapped, as contemplated within the scope of the invention.

Figure 6D:
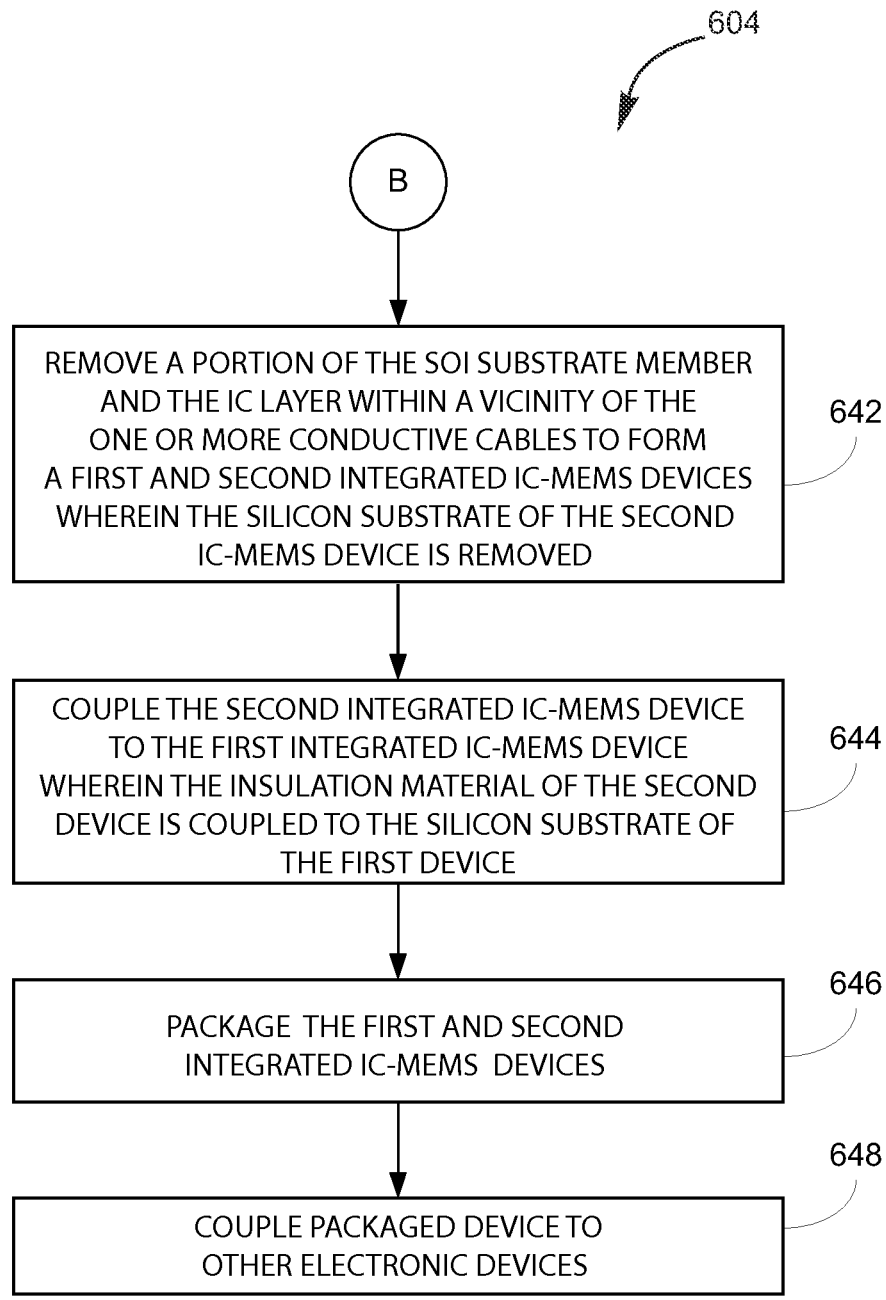

Another embodiment of the present method can be shown by method 604 shown in FIG. 6D. Following methods 601 and 602, method 604 provides an alternative process for removing a portion of the substrate member. Particularly, this method applies to the initial use of a SOI member. A first portion of the SOI member and the IC layer can be removed within a vicinity of the one or more conductive cables, step 642. This step may be used to form a first integrated IC-MEMS member and a second integrated IC-MEMS member. The first IC-MEMS member can include a second portion of the SOI member, which has a first and second surface region wherein the first surface region includes at least a part of the first surface region of the SOI member. The second portion of the IC layer having the one or more first bond pads can be configured overlying first surface region of the second portion of the SOI member. The second IC-MEMS member can include the third portion of the SOI member, which has a first and second surface region wherein the first surface region includes at least a part of the second surface region of the SOI member. The third portion of the IC layer having the one or more second bond pads can be configured overlying the first surface region of the third portion of the SOI member. In a specific embodiment, the third portion of the SOI member associated with the second integrated IC-MEMS member can have the bulk silicon material removed, leaving the insulator layer of the third portion of the SOI member with the third portion of the IC layer and configured overlying.

In an embodiment, the removal of the first portion of the SOI member can form the second surface region of the second portion of the SOI member and can isolate the second surface region of the third portion of the SOI member. In a specific embodiment, the second surface region of the second portion of the SOI member can be a side-wall region of the first IC-MEMS member, and the second surface region of the third portion of the SOI member can be the underside region of the second IC-MEMS member. In a specific embodiment, the underside or bottom surface region can be the bottom of the insulator layer of the third portion of the SOI member. Also, the one or more conductive cables can electrically couple the second and third portions of the IC layer via the first and second bond pads. In an embodiment, the conductive cables form the only interconnections between the first and second IC-MEMS members. Of course, there can be other variations, modifications, and alternatives.

Following the removal of the portion of the SOI member and the IC layer, the third portion of the SOI member can be coupled to the second portion of the SOI member, step 644. Particularly, the second surface region of the third portion of the SOI member can be coupled to the second surface region of the second portion of the SOI member. In a specific embodiment, the second IC-MEMS member can be rotated and vertically mounted on the side-wall of the first IC-MEMS member. Further details of this embodiment can be found in the description above for FIGS. 4A-4D. The resulting device may be packaged, step 646, and coupled to other electronic devices, step 648.

The above sequence of processes provides a fabrication method for a magnetic fields sensing device. As shown, the embodiment of the method uses a combination of steps including providing an IC substrate, forming several magnetic field sensor elements overlying the substrate, forming one or more conductive cable interconnections, etching a portion of the substrate, and mounting at least one of the magnetic field sensors to the substrate of the other sensors. Other alternatives can also be provided where steps are added, one or more steps are removed, or one or more steps are provided in a different sequence without departing from the scope of the claims herein. Further details of the present method can be found throughout the present specification.

Figure 7:
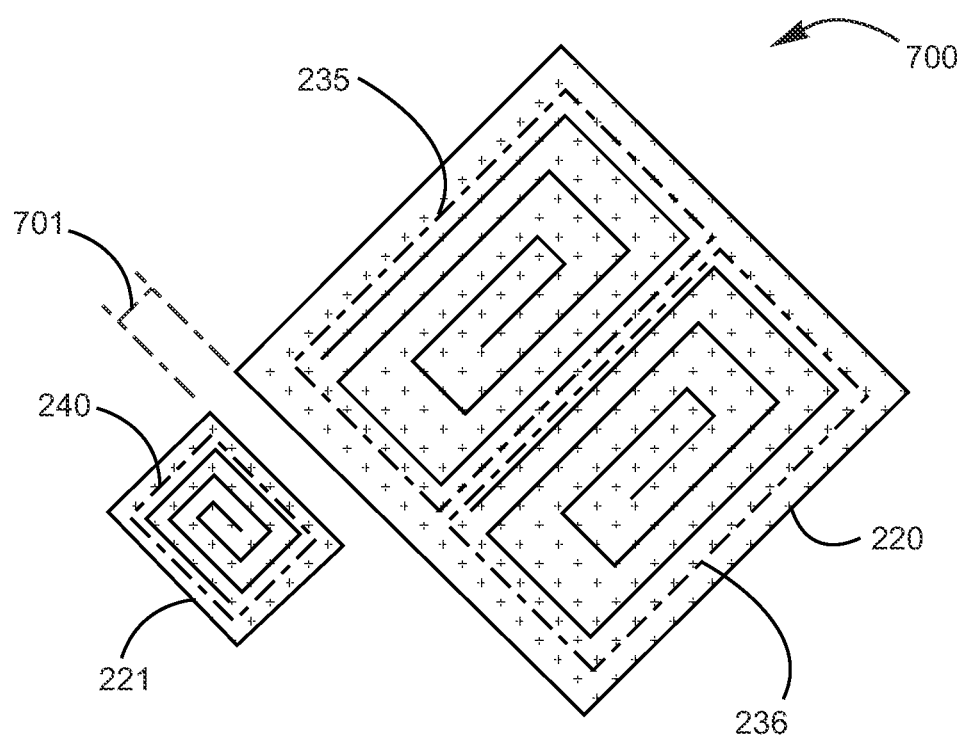
FIG. 7 is a simplified top diagram of a device for sensing magnetic fields according to an embodiment of the present invention.

FIG. 7 is a simplified top diagram of a device for sensing magnetic fields according to an embodiment of the present invention. As shown, device 700 includes a first IC-MEMS member and a second IC-MEMS member. This figure can represent the substrate post-etching without the one or more conductive cables to show more details regarding the layout. In a specific embodiment, the first IC-MEMS member can be the larger of the two shown, including a first magnetic field sensing element 235 and a second magnetic field sensing element 236. These devices can be configured on a first IC layer 220. Similarly, the second IC-MEMS member can be the smaller of the two shown, including a third magnetic field sensing element 240 configured on a second IC layer 221. These two IC-MEMS members can be separated by a distance 701, which can be approximately 200 microns, depending on the fabrication processes and design considerations. As shown, the first and second magnetic field sensing elements 235 and 236 are arranged in a parallel manner that is perpendicular to the configuration of the third magnetic field sensing element 240. Those skilled in the art will recognize other variations, modifications, and alternatives and the configuration and fabrication of these sensors.

Figure 8:
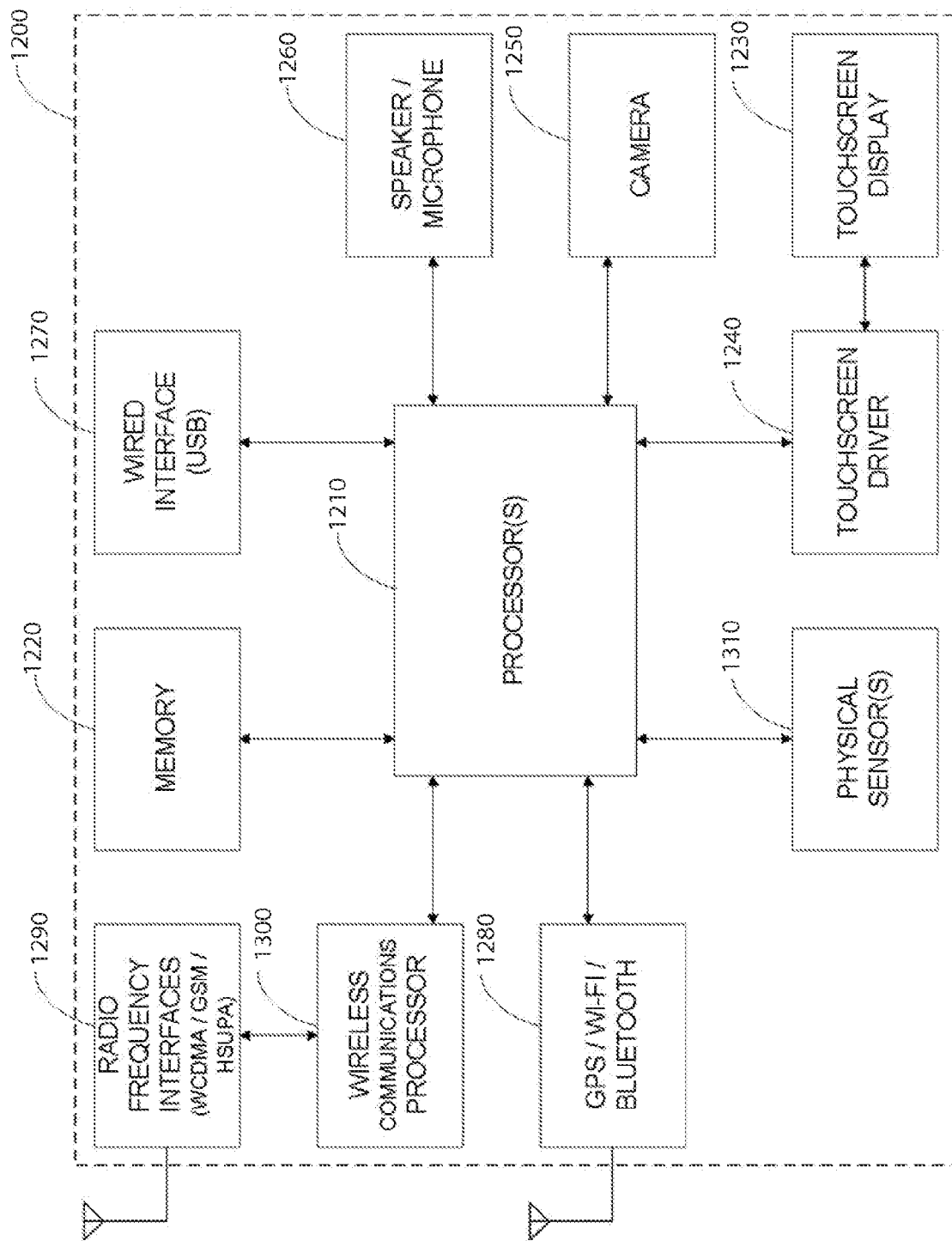
FIG. 8 is a simplified block diagram of a device incorporating various embodiments of the present invention.

FIG. 8 illustrates a functional block diagram of various embodiments of the present invention. In FIG. 8, a computing device 1200 typically includes an applications processor 1210, memory 1220, a touch screen display 1230 and driver 1240, an image acquisition device 1250, audio input/output devices 1260, and the like. Additional communications from and to computing device are typically provided by via a wired interface 1270, a GPS/Wi-Fi/Bluetooth interface 1280, RF interfaces 1290 and driver 1300, and the like. Also included in various embodiments are physical sensors 1310.

In various embodiments, computing device 1200 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1200 may include one or more processors 1210. Such processors 1210 may also be termed application processors, and may include a processor core, a video/graphics core, and other cores. Processors 1210 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1220 may include different types of memory (including memory controllers), such as flash memory (e.g. NOR, NAND), pseudo SRAM, DDR SDRAM, or the like. Memory 1220 may be fixed within computing device 1200 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1230 and driver 1240 may be based upon a variety of later-developed or current touch screen technology including resistive displays, capacitive displays, optical sensor displays, electromagnetic resonance, or the like. Additionally, touch screen display 1230 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1250 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1260 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1210 to enable the user to operate computing device 1200 by stating voice commands. Additionally, a speech engine may be provided in various embodiments to enable computing device 1100 to provide audio status messages, audio response messages, or the like.

In various embodiments, wired interface 1270 may be used to provide data transfers between computing device 1200 and an external source, such as a computer, a remote server, a storage network, another computing device 1200, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 1280 may also be provided to provide wireless data transfers between computing device 1200 and external sources, such as computers, storage networks, headphones, microphones, cameras, or the like. As illustrated in FIG. 6, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 6, GPS functionality is included as part of wireless interface 1280 merely for sake of convenience, although in implementation, such functionality is currently performed by circuitry that is distinct from the Wi-Fi circuitry and distinct from the Bluetooth circuitry.

Additional wireless communications may be provided via RF interfaces 1290 and drivers 1300 in various embodiments. In various embodiments, RF interfaces 1290 may support any future-developed or conventional radio frequency communications protocol, such as CDMA-based protocols (e.g. WCDMA), GSM-based protocols, HSUPA-based protocols, or the like. In the embodiments illustrated, driver 1300 is illustrated as being distinct from applications processor 1210. However, in some embodiments, these functionality are provided upon a single IC package, for example the Marvel PXA330 processor, and the like. It is contemplated that some embodiments of computing device 1200 need not include the RF functionality provided by RF interface 1290 and driver 1300.

FIG. 8 also illustrates computing device 1200 to include physical sensors 1310. In various embodiments of the present invention, physical sensors 1310 can be single axis or multi-axis Micro-Electro-Mechanical Systems (MEMS) based devices being developed by M-cube, the assignee of the present patent application. Physical sensors 1310 can include accelerometers, gyroscopes, pressure sensors, magnetic field sensors, bio sensors, and the like. One or more of these physical sensors 1310 may include devices such as those manufactured by the process disclosed previously. In other embodiments of the present invention, conventional physical sensors 1310 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1230 and driver 1240 and inputs/or outputs to physical sensors 1310 may be processed in parallel processing threads. In other embodiments, such events or outputs may be processed serially, or the like. Inputs and outputs from other functional blocks may also be processed in parallel or serially, in other embodiments of the present invention, such as image acquisition device 1250 and physical sensors 1310.

FIG. 8 is representative of one computing device 1200 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 8. For example, in various embodiments, computing device 1200 may lack image acquisition unit 1250, or RF interface 1290 and/or driver 1300, or GPS capability, or the like. Additional functions may also be added to various embodiments of computing device 1200, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a device for sensing magnetic fields, the method comprising:
   providing a substrate member having a first surface region and a second surface region;
   forming an integrated circuit (IC) layer overlying a portion of the first surface region and a portion of the second surface region of the substrate member, the IC layer having one or more first bond pads formed overlying the first surface region and one or more second bond pads formed overlying the second surface region;
   forming a first magnetic field sensor element operably coupled to the IC layer, the first magnetic field sensor element being disposed overlying the first surface region and being configured to detect at least a first direction;
   forming a second magnetic field sensor element operably coupled to the IC layer, the second magnetic field sensor element being disposed overlying the first surface region and being configured to detect at least a second direction;
   forming a third magnetic field sensor element operably coupled to the IC layer, the third magnetic field sensor element being disposed overlying the second surface region and being configured to detect at least a third direction;
   forming one or more conductive cables coupling at least one of the first bond pad(s) and at least one of the second bond pad(s) of the IC layer;
   removing a first portion of the substrate member and a first portion of the IC layer within a vicinity of the one or more conductive cables, thereby separating a second portion of the substrate member from a third portion of the substrate member, and separating a second portion of the IC layer from a third portion of the IC layer,
      wherein the second portion of the substrate member comprises a first surface region and a second surface region, the first surface region of the second portion of the substrate member including at least a part of the first surface region of the substrate member,
      wherein the third portion of the substrate member comprises a first surface region and a second surface region, the first surface region of the third portion of the substrate member including at least a part of the second surface region of the substrate member,
      wherein the second portion of the IC layer is disposed overlying the first surface region of the second portion of the substrate member, the second portion of the IC layer including the one or more first bond pads,
      wherein the third portion of the IC layer is disposed overlying the first surface region of the third portion of the substrate member, the third portion of the IC layer including the one or more second bond pads,
      wherein the one or more conductive cables electrically couple the second and the third portions of the IC layer via the first and second bond pad(s); and
   coupling the third portion of the substrate member to the second portion of the substrate member, the second surface region of the third portion of the substrate member coupled to the second surface region of the second portion of the substrate member.

2. The method of claim 1 wherein the forming of the one or more conductive cables comprises the steps of:
   forming a metal or metal alloy material overlying at least a portion of the IC layer and at least one of the first bond pad(s) and at least one of the second bond pad(s),
   etching the metal or metal alloy material to form one or more conductive cables coupled at least one of the first bond pad(s) and at least one of the second bond pad(s).

3. The method of claim 1 wherein the forming of the one or more conductive cables comprises the steps of:
   forming a first cable insulator material overlying at least a portion of the IC layer,
   forming a metal or metal alloy material overlying at least a portion of the first cable insulator material and at least one of the first bond pad(s) and at least one of the second bond pad(s),
   etching the metal or metal alloy material to form one or more conductive cables coupling at least one of the first bond pad(s) and at least one of the second bond pad(s), and
   forming a second cable insulator material overlying the one or more conductive cables and the first cable insulator material.

4. The method of claim 3 wherein the forming of the one or more conductive cables further comprises the step of annealing the first and second cable insulator material.

5. The method of claim 1 wherein the removing of a portion of the substrate member and the IC layer comprises deep reactive ion etching (DRIE) process, a backside DRIE process, or a controlled DRIE process.

6. The method of claim 1 wherein the first, second, and third magnetic field sensor elements comprise anisotropic magneto-resistive (AMR) devices, giant magneto-resistive (GMR) devices, or tunnel junction magneto-resistive (TMR) devices.

7. The method of claim 1 wherein coupling the second surface region of the third portion of the substrate member to the second surface region of the second portion of the substrate member comprises coupling a bottom surface region of the third portion of the substrate member to a side surface region of the second portion of the substrate member.

8. A method for fabricating a device for sensing magnetic fields, the method comprising:
  providing a substrate-on-insulator (SOI) member having a first surface region and a second surface region, the SOI member comprising an insulation layer overlying a substrate member;
  forming an integrated circuit (IC) layer overlying a portion of the first surface region and a portion of the second surface region of the substrate member, the IC layer having one or more first bond pads formed overlying the first surface region and one or more second bond pads formed overlying the second surface region;
  forming a first magnetic field sensor element operably coupled to the IC layer, the first magnetic field sensor element being disposed overlying the first surface region and being configured to detect at least a first direction;
  forming a second magnetic field sensor element operably coupled to the IC layer, the second magnetic field sensor element being disposed overlying the first surface region and being configured to detect at least a second direction;
  forming a third magnetic field sensor element operably coupled to the IC layer, the third magnetic field sensor element being disposed overlying the second surface region and being configured to detect at least a third direction;
  forming one or more conductive cables coupling at least one of the first bond pad(s) and at least one of the second bond pad(s) of the IC layer;
  removing a first portion of the SOI member and a first portion of the IC layer within a vicinity of the one or more conductive cables, thereby separating a second portion of the SOI member from a third portion of the SOI member, and separating a second portion of the IC layer from a third portion of the IC layer,
    wherein the second portion of the SOI member comprises a first surface region and a second surface region, the first surface region of the second portion of the substrate member including at least a part of the first surface region of the SOI member,
    wherein the third portion of the SOI member comprises a first surface region and a second surface region, the first surface region of the third portion of the substrate member including at least a part of the second surface region of the SOI member,
    wherein the second portion of the IC layer is disposed overlying the first surface region of the second portion of the SOI member, the second portion of the IC layer including the one or more first bond pads,
    wherein the third portion of the IC layer is disposed overlying the first surface region of the third portion of the SOI member, the third portion of the IC layer including the one or more second bond pads,
    wherein the first and second magnetic field sensor elements are operably coupled to the second portion of the IC layer and the third magnetic field sensor element is operably coupled to the third portion of the IC layer,
    wherein the one or more conductive cables electrically couple the second and the third portions of the IC layer via the first and second bond pad(s); and
  coupling the third portion of the SOI member to the second portion of the substrate member, the second surface region of the third portion of the SOI member coupled to the second surface region of the second portion of the SOI member.

9. The method of claim 8 wherein the forming of the one or more conductive cables comprises the steps of:
  forming a metal or metal alloy material overlying at least a portion of the IC layer and at least one of the first bond pad(s) and at least one of the second bond pad(s),
  etching the metal or metal alloy material to form one or more conductive cables coupled at least one of the first bond pad(s) and at least one of the second bond pad(s).

10. The method of claim 8 wherein the forming of the one or more conductive cables comprises the steps of:
  forming a first cable insulator material overlying at least a portion of the IC layer,
  forming a metal or metal alloy material overlying at least a portion of the first cable insulator material and at least one of the first bond pad(s) and at least one of the second bond pad(s),
  etching the metal or metal alloy material to form one or more conductive cables coupling at least one of the first bond pad(s) and at least one of the second bond pad(s), and
  forming a second cable insulator material overlying the one or more conductive cables and the first insulator material.

11. The method of claim 10 wherein the forming of the one or more conductive cables further comprises the step of annealing the first and second cable insulator material.

12. The method of claim 8 wherein the removing of a portion of the substrate member and the IC layer comprises deep reactive ion etching (DRIE) process, a backside DRIE process, or a controlled DRIE process.

13. The method of claim 8 wherein the first, second, and third magnetic field sensor elements comprise anisotropic magneto-resistive (AMR) devices, giant magneto-resistive (GMR) devices, or tunnel junction magneto-resistive (TMR) devices.

14. The method of claim 8 wherein coupling the second surface region of the third portion of the SOI member to the second surface region of the second portion of the SOI member comprises coupling a bottom surface region of the third portion of the SOI member to a side surface region of the second portion of the SOI member.

* * * * *